United States Patent
Adeli et al.

[11] Patent Number: 5,815,394
[45] Date of Patent: Sep. 29, 1998

[54] METHOD AND APPARATUS FOR EFFICIENT DESIGN AUTOMATION AND OPTIMIZATION, AND STRUCTURE PRODUCED THEREBY

[75] Inventors: Hojjat Adeli, Powell, Ohio; Hyo Seon Park, Kyungki-do, Rep. of Korea

[73] Assignee: The Ohio State University Research Foundation, Columbus, Ohio

[21] Appl. No.: 628,588

[22] Filed: Apr. 4, 1996

[51] Int. Cl.[6] .......................... G06F 19/00; G06G 7/6466
[52] U.S. Cl. ................. 364/468.03; 364/149; 364/151; 364/468.09; 364/468.24; 395/24; 395/268; 395/241; 395/11
[58] Field of Search ............................. 364/468.03, 149, 364/156, 151, 402, 434, 401, 468.09, 468.01, 468.29; 395/22, 25, 24, 2.68, 2.11, 2.41, 11

[56] References Cited

U.S. PATENT DOCUMENTS

| | | | |
|---|---|---|---|
| 3,826,904 | 7/1974 | Leonard et al. | 235/151.1 |
| 4,744,027 | 5/1988 | Bayer et al. | 364/402 |
| 4,744,028 | 5/1988 | Karmarkar | 364/402 |
| 4,801,205 | 1/1989 | Tatsuno | 356/336 |
| 4,914,563 | 4/1990 | Karmarkar et al. | 364/148 |
| 4,914,615 | 4/1990 | Karmarkar et al. | 364/754 |
| 5,038,270 | 8/1991 | Tozawa et al. | 364/148 |
| 5,107,452 | 4/1992 | Karmarkar et al. | 364/754 |
| 5,140,670 | 8/1992 | Chua et al. | 395/24 |
| 5,195,170 | 3/1993 | Eberhardt | 395/24 |
| 5,282,267 | 1/1994 | Woo, Jr. et al. | 395/157 |
| 5,305,230 | 4/1994 | Matsumoto et al. | 364/495 |
| 5,335,323 | 8/1994 | Kolnick | 395/164 |
| 5,408,424 | 4/1995 | Lo | 364/424.01 |
| 5,418,864 | 5/1995 | Murdock et al. | 382/309 |
| 5,420,963 | 5/1995 | Kuwata | 395/22 |
| 5,461,696 | 10/1995 | Frank et al. | 395/2.41 |
| 5,579,228 | 11/1996 | Kimbrough et al. | 364/424.05 |

OTHER PUBLICATIONS

Adeli and Park, Optimization of Space Structures by Neural Dynamics, *Neural Networks*, vol. 8, No. 5, pp. 769–781 (1995).

Adeli and Park, Hybrid CPN–Neural Dynamics Model for Discrete Optimization of Steel Structures, *Microcomputers in Civil Engineering*, vol. 11, pp. 355–366 (1996).

Adeli and Park, Counterpropagation Neural Networks in Structural Engineering, *Journal of Structural Engineering*, pp. 1205–1212 (Aug. 1995).

Adeli and Park, A Neural Dynamics Model For Structural Optimization–Theory, *Computers & Structures*, vol. 57, No. 3, pp. 383–390 (1995).

Park and Adeli, A Neural Dynamics Model For Structural Optimization–Application To Plastic Design Of Structure, *Computers & Structures*, vol. 57, No. 3, pp. 391–439 (1995).

*Primary Examiner*—Reba I. Elmore
*Assistant Examiner*—Ramesh Patel
*Attorney, Agent, or Firm*—Standley & Gilcrest

[57] ABSTRACT

A computational model for optimal and automated design of structures based on neural dynamic is disclosed. The disclosed neural dynamic model for structural optimization integrates a penalty function method, Lyapunov stability theorem, Kuhn-Tucker condition and neural dynamic concepts. The model, which has global convergence, is general and may be applied to many nonlinear programming problems such as the design of automobiles, airplanes, fighters, building structures, and high-performance computer chips.

9 Claims, 18 Drawing Sheets

Fig. 1 TOPOLOGY OF AN ANN AND THREE CONNECTION TYPES.

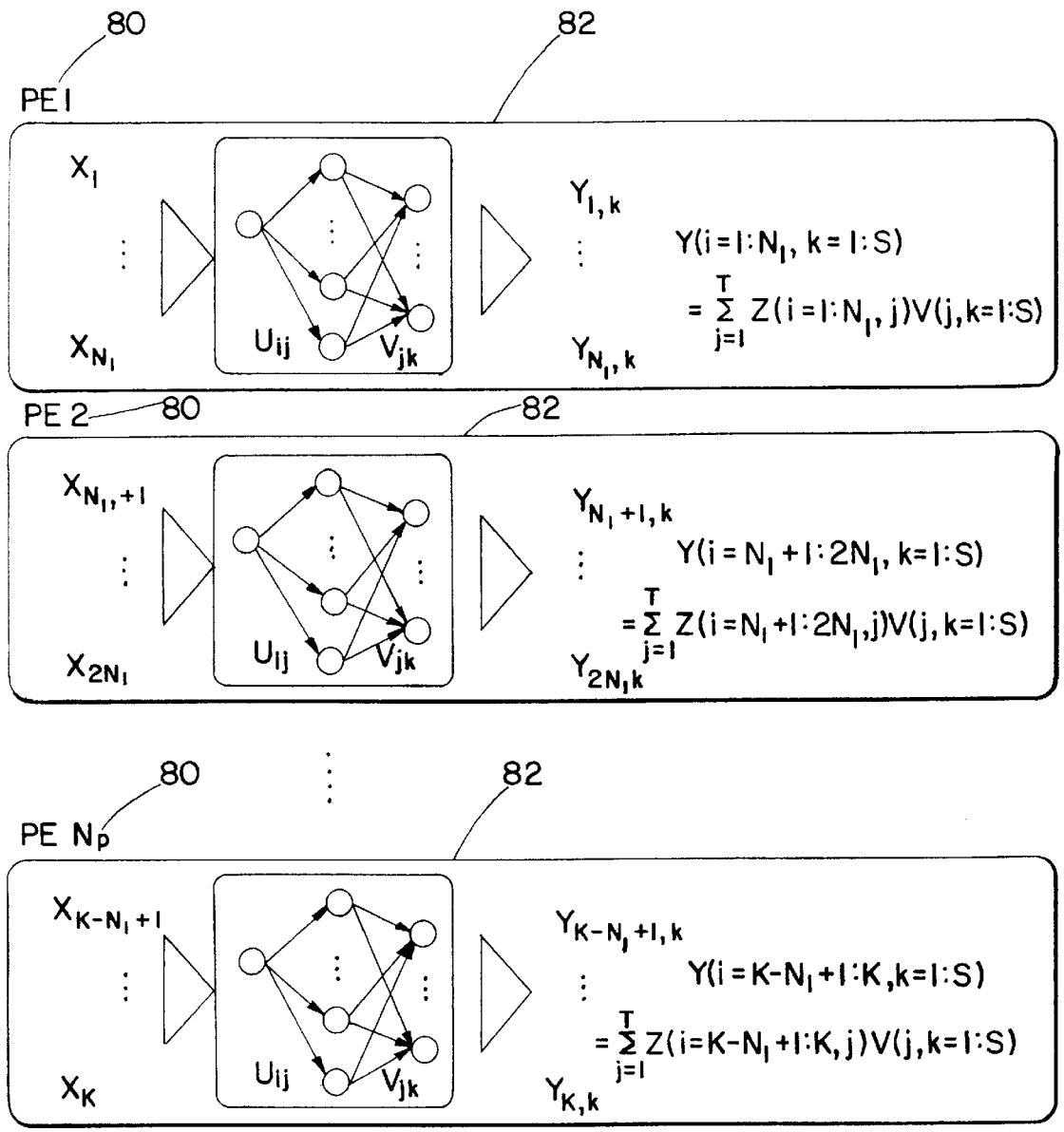
 PRIVATE COPY
Fig. 5

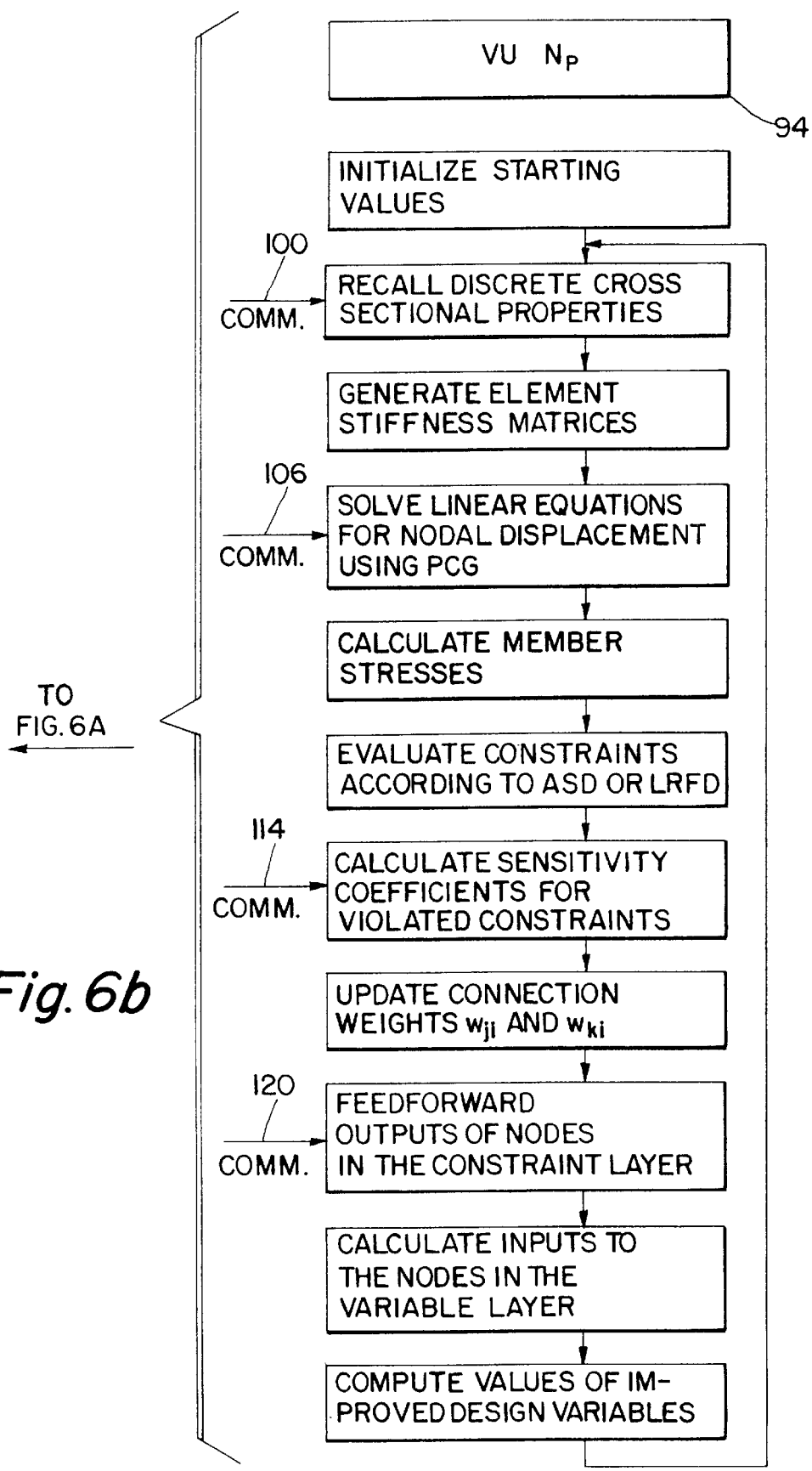

METHOD AND APPARATUS FOR EFFICIENT DESIGN AUTOMATION AND OPTIMIZATION, AND STRUCTURE PRODUCED THEREBY

TECHNICAL FIELD

The present invention is in the field of design automation and optimization, particularly as it pertains to structural engineering.

BACKGROUND

In the design of structures, systems have been developed to achieve optimization through the use of algorithms. However, algorithms of the prior art often fail in terms of convergence and stability, particularly for large nonlinear engineering systems. For instance, existing Computer-Aided Design (CAD) software systems have rudimentary optimization capabilities and can hardly handle large nonlinear systems. Another problem with prior art systems is that the data models employed do not take advantage of computing resources available today. Optimization of large structures with thousands of members subjected to actual constraints of commonly-used design codes requires an inordinate amount of computer processing and can be done only on multiprocessor supercomputers.

Automation of design, and/or its optimization, particularly of one-of-a-kind engineering systems, is considered a particularly challenging problem. The inventors and others have been working on creating novel design theories and computational models with two broad objectives: automation and optimization. (Adeli, H. and Alrijleh, M. M., *Roof Expert, PC AI*, Vol. 1, No. 2, pp. 30–34 (1987); Adeli, H. and Balasubramanyam, K. V., *A Novel Approach to Expert Systems for Design of Large Structures*, AI Magazine, Winter, pp. 54–63 (1988); Adeli, H. and Balasubramanyam, K. V., *Expert Systems for Structural Design—A New Generation*, Prentice-Hall, Englewood Cliffs, N.J. (1988); Paek, Y. and Adeli, H, STEELEX: *A Coupled Expert System for Integrated Design of Steel Structures*, Engineering Applications of Artificial Intelligence, Vol. 1, No. 3, pp. 170–180 (1988); Adeli, H. and Kamal, O., *Parallel Processing in Structural Engineering*, Elsevier, London (1993); and Adeli, H. and Hung, S. L., *Machine Learning—Neural Networks, Genetic Algorithms, and Fuzzy Systems*, John Wiley and Sons, New York. (1995)).

It is an object of the present invention to provide an improved design process that may be advantageously applied to the design and/or optimization of structures, such as aerospace, automotive, and civil engineering structures, including those that are one-of-a-kind or that may be mass produced, especially those that involve highly nonlinear systems. Such a process involves the use of an appropriate data model and algorithms that are robust and provide rapid convergences even for such highly nonlinear systems.

It is also an object of the present invention to produce structures arrived at through the improved design process of the present invention. Such structures may include any structure, such as aerospace, automotive, and civil engineering structures, including those that are one-of-a-kind or that may be mass produced.

It is also an object of the present invention to design structures by optimizing structural parameters while reducing the amount of computing time required for the task.

In view of the following description of the invention or through its practice, other advantages, or the solution to other problems, may become apparent.

SUMMARY OF THE INVENTION

The present invention includes a design process involving the use of new computing paradigms to create computational models for structural design automation. The present invention addresses problems in prior art systems by exploiting a neural dynamic model and implementing algorithms on a distributed memory multiprocessor. The method of the present invention is robust and converges fast even for highly nonlinear systems.

The method of the present invention facilitates design automation and optimization of large engineering systems. It may be applied to any type of resource optimization problem that may be described as a nonlinear programming problem including various engineering designs such as automobiles, airplanes, fighters, building structures, and high-performance computer chips. For example, the method may be applied to minimum weight design steel high-rise building structures subjected to the highly nonlinear constraints of actual design codes such as the American Institute of Steel Construction (AISC) Allowable Stress Design (ASD) and Load Resistance Factor Design (LRFD) specifications where nonlinear second order effects have to be taken into account. The computational model of the present invention finds the minimum weight design for very large structures subjected to multiple dead, live, and wind loadings automatically.

A high degree of parallelism may be exploited by the neural dynamic computing model of the present invention. The robust data parallel neural dynamic model of the present invention may be used for discrete optimization of large structures such as in the problem of determining the minimum weight design of steel structures made of commercially available shapes. In this application of the present invention, the design consists of preliminary design, structural analysis, and the selection of the final members of the steel structure. As such, the final optimum solution for minimum weight design of steel structures may be obtained automatically without any intervention from the user.

Parallelism may be exploited in four stages of the neural dynamic model as applied to minimum weight design of a steel structure:

mapping the continuous design variables to discrete sections using a trained counter propagation neural (CPN) network, generating the element of stiffness matrices in the local coordinates, transforming them to the global coordinates, and solving the resulting simultaneous linear equations using the preconditioned conjugate gradient (PCG) method, evaluation of the constraints based on the AISC ASD or LRFD specifications, and computation of the improved design variables from the nonlinear neural dynamic model.

Robustness of the structural optimization algorithm of the present invention is of considerable significance since many structural optimization algorithms show convergence or instability problems when applied to large structures such as highrise building structures subjected to the actual highly nonlinear constraints of the AISC ASD or LRFD specifications.

BRIEF DESCRIPTION OF THE DRAWINGS

FIG. 5 is a distributed data structure diagram for a parallel recalling process in accordance with a preferred embodiment of the present invention;

FIGS. 6a and 6b are flow diagram for data parallel distributed algorithm in accordance with a preferred embodiment of the present invention;

DETAIL DESCRIPTION OF PREFERRED EMBODIMENT(S)

The following description focuses on a presently preferred embodiment of the present invention directed to the minimum weight design of large steel structures. The minimum weight design of large steel structures is merely illustrative of the types of engineering design problems to which the method of the present invention may be applied. The method of the present invention may be applied to any type of resource optimization problem that can be described as a nonlinear programming problem. It may be used for automation and optimization of various engineering designs such as automobiles, airplanes, fighters, building structures, and high-performance computer chips.

Neural network models inspired by biological nervous systems are providing a new approach to problem solving. Neural network applications in structural engineering have been based on backpropagation and counter propagation. Optimization is an area in which the neural network has not been widely used. Two different types of optimization problems may be solved using neural networks. The first type is control of mobile robots in which a neural network is used to learn the relationship between sensory input and behavior. The second type is classical optimization in which a neural network is used to find a node configuration (an equilibrium point) that minimizes an energy or objective function.

Figure 1:
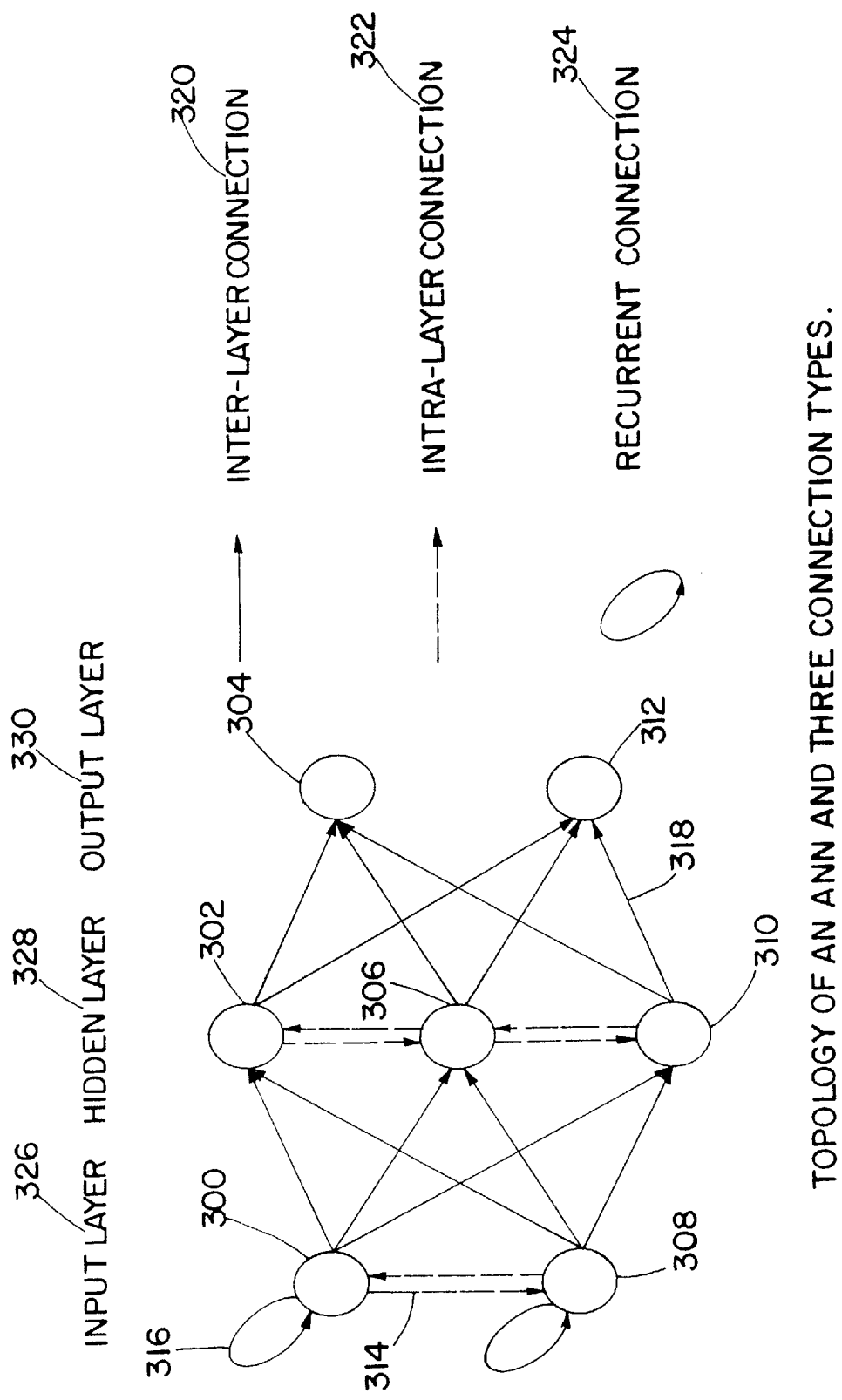
FIG. 1 is a topological diagram of an artificial neural network.

Referring now to FIG. 1, an artificial neural network (ANN) is a directed graph composed of nodes 300, 302, 304, 306, 308, 310, 312 and connections between nodes 314, 316, 318. Generally, an artificial neural network consists of three elements: an organized topology of interconnected nodes (network), a method of encoding information (learning), and a method of recalling information (retrieving).

ANN topology consists of layers of nodes linked by weighted interconnections. A node has an activation function that evaluates inputs and generates an output as an input to other nodes. A layer that receives inputs from outside network is called an input layer 326 and a layer that emits computed output to the environment is an output layer 330. The layers lying between the input and output layers are called hidden layers 328.

Characteristics of ANN topologies are described in terms of connection and interconnection types.

(1) Connection types. There are two primary connection types: excitatory and inhibitory. An excitatory connection increases the value of input to a connected node and is usually represented by a positive sign. On the other hand, an inhibitory connection decreases the value of input to a connected node and is usually represented by a negative sign.

(2) Interconnection types. The three interconnection types are intra-layer (lateral connection) 320, inter-layer 322, and recurrent connections 324. Intra-layer connections are connections between nodes in the same layer 320. Inter-layer connections are connections between nodes in different layers 322. Recurrent connections are direct loops of connections to the same node 324.

Learning may be defined as any change in the weights to produce some desirable state, and a learning method is a rule that adjusts the weights to the desirable state. Learning methods may be classified into two categories: supervised learning and unsupervised learning.

(1) Supervised learning. Learning is performed on the basis of direct comparison of the output of the network with the given desired output. Backpropagation is a widely used example of supervised learning algorithms.

(2) Unsupervised learning. Learning goal is not defined. The network is expected to create categories from the correlations of the input data, and to produce output corresponding to the input category. Counterpropagation is an example of unsupervised learning algorithms.

Figure 2:
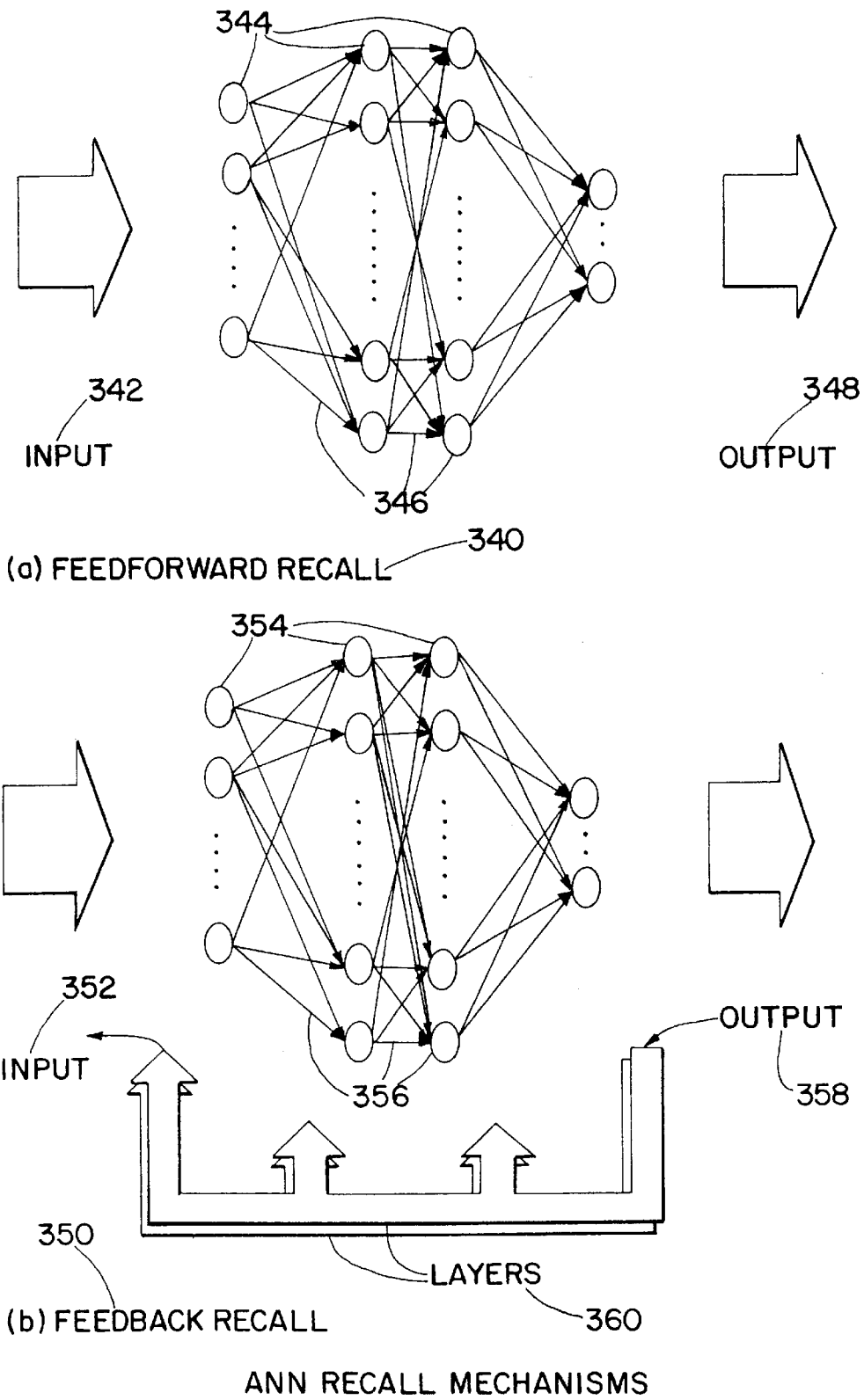
FIG. 2 is an conceptual diagram of the feedforward and feedback recall mechanism.

Referring to FIG. 2, a recalling method may be defined as the method of finding the corresponding output from the given input after the learning process. The ANN recall mechanisms may be divided into two main categories. One is the feedforward recall 340 and the other is the feedback recall mechanism 350. During the feedforward recall 340, an input 342 is passed through nodes 344 and weights 346, and the corresponding output 348 is produced in one pass. In the feedback recall mechanism 350, an input 352 is passed through the nodes 354 and weights 356, and then an output 358 is produced which is fed back into an input 352 or a specific layer 360 until there is no change in the weights.

Neural Dynamics Model

A dynamic system may be defined as a system of differential equations whose state changes in time.

$$\frac{dX_i}{dt} = \dot{X}_i = f_i(X_1, X_2, \ldots, X_n) \quad \text{Eqn. (1)}$$

where $X(t)=[X_1(t), X_2(t), \ldots, X_n(t)]^T$ represents a vector of time dependent variables. In general, the rate of change of each variable $\dot{X}_i(t)$ is a function of $X_i(t)$ itself and all the other variables. A dynamic system is defined as the movement through time of solution trajectories for a system of differential equations. Each trajectory is described by a vector composed of the values of all the variables in the system at any given time. If $f_1(X_1, X_2, \ldots X_n)=0$ then a point X is called an equilibrium point of Eqn (1).

In a neural dynamic system, a system of differential equations reflecting the characteristics of problems to be solved describes how the node activations change, where connection weights and nodes represent the dynamic system and outputs from the nodes represent the state of the system at a given instance in time. A pseudo-objective function is formulated by an exterior penalty function method that transforms the constrained optimization problem to a corresponding unconstrained optimization problem:

$$\begin{aligned} V(X, r_n) &= F(X) + r_n P(X) \quad \text{Eqn. (2)} \\ &= F(X) + r_n \left\{ \sum_{j=1}^{M} [g_j^+(X)]^2 + \sum_{k=1}^{N} [g_k^+(X)]^2 \right\} \end{aligned}$$

where $F(X)$ is the objective function (the weight of the structure), $P(X)$ is the penalty function, and $r_n$ is the penalty coefficient, $$g_j^+(X) = max[0, g_j(X)] \quad \text{Eqn. (3)}$$

$$g_k^+(X) = max[0, g_k(X)] \quad \text{Eqn. (4)}$$

$$g_j^+(X) = max[0, g_j(X)| \quad \text{Eqn. (3)}$$

$$g_k^+(X) = max[0, g_k(X)| \quad \text{Eqn. (4)}$$

$$g_j(X) = \frac{\sigma_j}{\sigma_j^a} - 1 \quad j = 1, M \quad \text{Eqn. (5)}$$

$$g_k(X) = \frac{d_k}{d_k^a} - 1 \quad k = 1, N \quad \text{Eqn. (6)}$$

M is the number of the members in the structure, N is the number of constrained degrees of freedom, $\sigma_j$ is the stress in the jth member, $d_k$ is the kth constrained displacement degree of freedom, and $\sigma_j^a$ and $d_k^a$ are the allowable stress and displacement, respectively.

The system of differential equations is obtained by taking the derivative of the pseudo-objective function with respect to time, and forcing the pseudo-objective function (Eqn. 2) to satisfy the Lyapunov stability theorem:

$$\frac{dV}{dt} = \dot{V} = \frac{dV}{dX} \dot{X} = \leq 0 \quad \text{Eqn. (7)}$$

The resulting system of differential equations in the neural dynamics model is $$\dot{X} = -\frac{dV}{dX} = -\nabla F(X) - \quad \text{Eqn. (8)}$$

$$r_n \left\{ \sum_{j=1}^{M} g_j^+(X) \nabla g_j(X) + \sum_{k=1}^{N} g_k^+(X) \nabla g_k(X) \right\}$$

Therefore, the dynamic system always evolves such that the value of the pseudo-objective function for the structural optimization problem does not increase ($dV/dt \leq 0$).

A CounterPropagation Neural network (CPN) is a mapping neural network employing both Kohonen learning and Grossberg learning rules.

Optimal design of steel structures according to the commonly-used design specifications such as the AISC Allowable Stress Design (ASD) specifications requires computation of allowable member stresses. Allowable stresses in turn are functions of cross sectional properties of the members. The allowable compressive stress of members in space axial-load structures is a function of the slenderness ratio, $KL/r$, where K is the effective length factor and r is the value of the radius of gyration of the cross-section. Assuming $K=1$, the allowable stress of a compression member is governed by $r_y$, the radius of gyration with respect to the minor axis of the cross-section. Thus, the efficiency of sections for carrying compressive forces generally increases as the ratio $r_y/r_x$ approaches one ($r_x$ is the radius of gyration with respect to the major axis). There are 295 W shapes in the AISC ASD manual. Preferably, a subset of this set is used as potentially economical sections for axial-force structures. This set consists of 61 W shapes for whom $0.5 < r_y/r_x < 1$.

The design variables in the structural optimization problem are cross-sectional areas of the members. But, the allowable compressive stress is a function of the radius of gyration of the cross-section. To map the two variables, a CPN network is trained to learn the relationship between the cross-sectional area and the radius of gyration for the aforementioned subset of W shapes. The input is the cross-sectional areas of W shapes and the output is their radii of gyration about major ($r_x$) and minor ($r_y$) axes. The number of training instances is equal to the number of W shapes used (61). The result of training is stored in the form of $3 \times 61=183$ connection weights. The numbers of nodes in the competition and interpolation layers of the CPN network are 63 and 3, respectively.

The relationship between the cross-sectional area and the radii of gyration is recalled in each iteration of the optimization process using the trained CPN. This recalling process consists of two steps. The first step is to find the winning node among the nodes in the competition layer for a given input. When a continuous relationship is assumed between the input and output variables the number of winning nodes may be more than one (up to the number of nodes in the competition layer). In contrast, when input and output are discrete variables the number of winning nodes for each variable is set to one and the value of the connection weight for the link connecting the winning node to the variable is close, but greater than or equal to the value of the variable.

Thus, a winning node is selected for each variable. After selecting the winning nodes for all the variables, the output (radii of gyration) is recalled in the second step based on the output from the winning nodes. The trained CPN maps an arbitrary given instance (design variable) to the nearest encoded output (radii of gyration).

The present invention is based on a hybrid counter propagation-neural dynamics model and a new neural network topology. It may be used for structural optimization of large structures with discrete members. The nonlinear neural dynamics model is based on Eqn. 8 and acts as an optimizer to produce improved design solutions for given design constraints starting from some initial design solution and using first order sensitivity information. The sensitivity information and the magnitudes of the constrained violations, required for operations of the neural dynamics model, are evaluated based on the discrete cross sectional properties. The discrete cross sectional properties are provided by the trained CPN.

The hybrid neural dynamics model consists of four components: the neural dynamics model, counter propagation neural network, structural analysis, and calculation of sensitivity coefficients. The neural dynamics model consists of two distinct layers: the variable layer and the constraint layer. Nodes in the constraint layer receive the discrete cross sectional properties from the CPN as inputs, evaluate the prescribed constraints, and generate the magnitudes of constraint violations as outputs. The functional activations at the nodes in the variable layer receive information about the search direction (encoded as the weights of the links connecting the constraint layer to the variable layer) and magnitudes of constraint violations as inputs and generate the improved design solutions as outputs.

The number of stress constraints is equal to or a multiple of the number of members in the structure (for the case of multiple loadings). This number is in the thousands for a large structure with a few thousand members. As such, the number of violated stress constraints requiring computation of sensitivity coefficients tends to be very large. Thus, it requires an excessive amount of CPU time. A design linking strategy may be employed as is commonly done in actual design of structures. The members grouped as one design variable have the same cross sectional properties; but, each member in the group has different magnitude of the constraint violation and different sensitivity coefficients for a given design solution.

To accelerate the optimization process and reduce the required CPU time for computation of sensitivity coefficients, only the most violated constraint in each group of members linked together as one design variable is allowed to represent the status of the stress constraint for that group. Therefore, a competition is introduced in the constraint layer to select the most critical node among the nodes belonging to one linked design variable. Let $O_{ci}$ be the magnitude of constraint violation multiplied by the penalty parameter for the ith design variable (the output of a node in the constraint layer):

$$O_{ci} = r_n max\{0, max\{g_j(X)\}\} \text{ for } j=1, D_i \qquad \text{Eqn. (9)}$$

where Di is the number of members grouped as the ith design variable.

The counter propagation part of the model consists of two layers: competition layer and interpolation layer. Nodes in the competition layer receive the values of improved design solutions from the nodes in the variable layer, calculate the Euclidean distances between the input and the connection weights, and select the winning node. Nodes in the interpolation layer recall the corresponding cross sectional properties encoded in the connection weights associated with the winning node.

The adjoint variable method is used for sensitivity calculations. By using the adjoint variable method direct inverting of the structure stiffness matrix in calculation of derivatives of displacements with respect to design variables is avoided. Sensitivity coefficients of the objective and constraints functions are also linked similar to design variables (described in steps 2 and 10 of the hybrid algorithm to be presented later).

Figure 3:
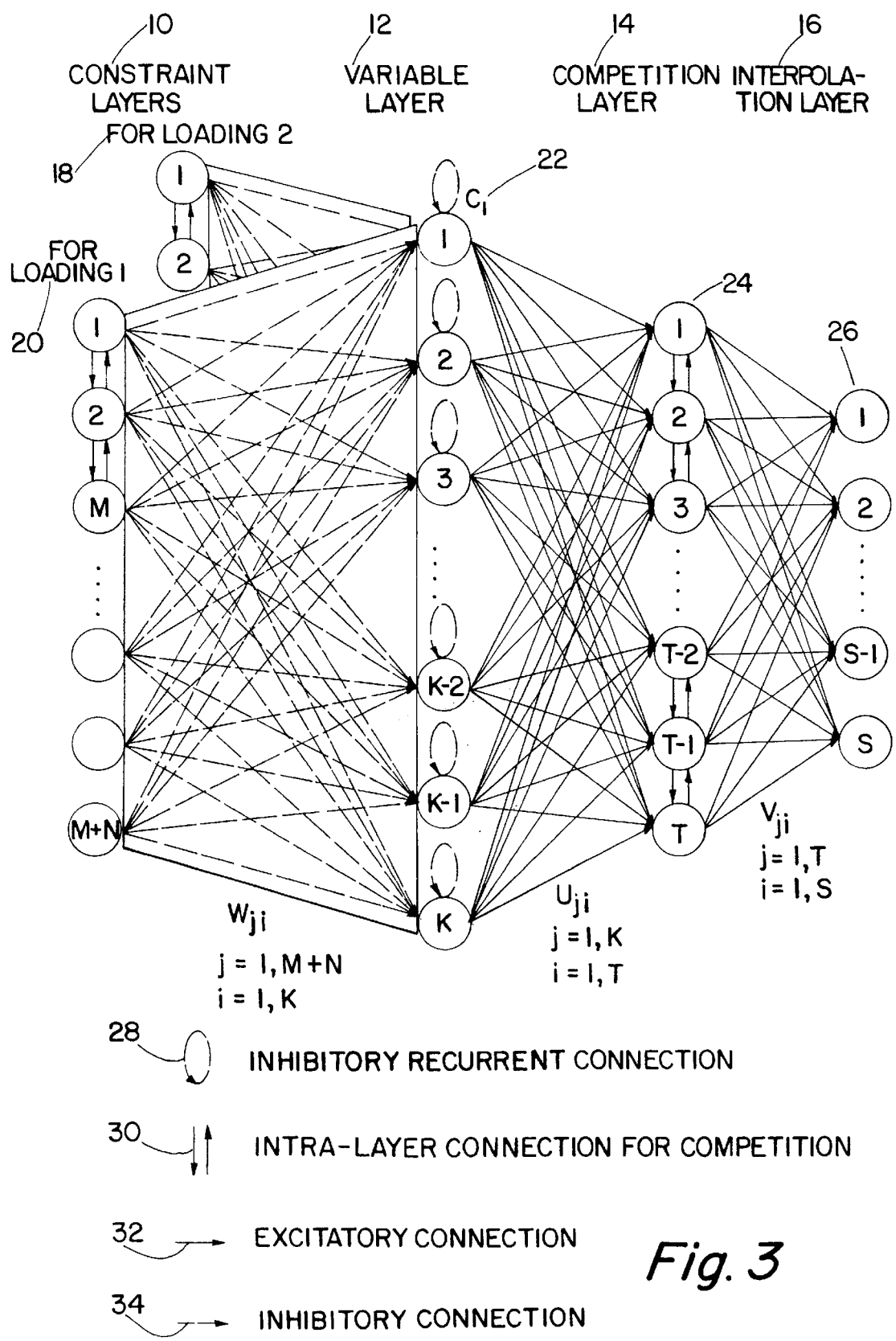
FIG. 3 is topological diagram of a neural dynamic model in accordance with the present invention.

Referring to FIG. 3, the topology of the hybrid counter propagation-neural dynamics model is shown. The model is comprises four layers: a constraint layer 10, a variable layer 12, a competition layer 14, and an interpolation layer 16. The number of nodes in the variable layer 12 is equal to the number of independent design variables (K) in the structural optimization problem. The number of nodes in the constraint layer 10 is equal to total number of constraints (M+N) imposed on the structure.

The number of nodes in the competition layer (T) 14 is equal to the number of available sections (e.g., 61 for 61 W shapes). The number of nodes in the interpolation layer (S) 16 is equal to the number of sectional properties required for calculation of the allowable stresses. This number is 3 for space axial-load structure (A, $r_x$, and $r_y$) and 11 for general space frame structures (A, $I_x$, $I_y$, $S_x$, $S_y$, $r_x$, $r_y$, $r_T$, J, $b_f$, and $d/A_f$). (A list of notations may be found in Appendix A).

Three types of connections are used to link nodes: inter-layer connection 28, intra-layer connection 30, and recurrent connection 32. Nodes between different layers are connected by inter-layer links. In the neural dynamics parts of the model, sensitivity coefficients of constraints are encoded as weights of the inhibitory connections from the constraint layer to the variable layer ($W_{ji}$, i=1, K; j=1, M+N). In the trained CPN part of the model, the cross-sectional areas of available W shapes are encoded in the connections from the variable layer to the competition layer ($U_{ji}$, i=1, T; j=1, K) and their corresponding cross sectional properties such as radii of gyration are encoded in the excitatory connections from the competition layer to the interpolation layer ($V_{ji}$ i=1, S; j=1, T).

Intra-layer connections that link nodes in the same layer are employed to select the winning nodes in the constraint and competition layers. In the variable layer, the sensitivity coefficients of the objective function are assigned to the recurrent connections.

The hybrid counter propagation-neural dynamics algorithm for structural optimization with discrete member sizes subject to displacement and stress (including buckling) constraints is presented in the following steps.

Step 1. Initialize the design variables X, and select an initial value for the penalty parameter r and the tolerance for the optimization convergence, $\epsilon$.

Step 2. Compute the linked sensitivity coefficients for the original objective function (weight of the structure).

$$C_i = \frac{\partial F(X)}{X_i} = \sum_{j=1}^{D_i} \frac{\partial F(X)}{\partial Y_j} \frac{\partial Y_j}{\partial X_i} \quad i = 1, K \qquad \text{Eqn. (10)}$$

where X, is the ith independent design variable, $Y_j$ is the jth dependent variable in the ith design variable, and $D_i$ is the number of dependent variables grouped as the ith design variable. Assign the coefficients to the inhibitory recurrent connections in the variable layer. The geometry of the structure is assumed to be fixed so the sensitivity coefficients of the objective function are constant during the optimization process. Thus, the inhibitory recurrent connection weights are assigned before the optimization iteration begins.

Step 3. Set the iteration counter, n=0.

Step 4. Feed forward the values of design solutions from the variable layer to the nodes in the competition layer of the CPN, and calculate the Euclidean distance between the ith design variable (i=1, K) and the connection weights $U_{ij}$ between this variable and the T available standard shapes.

$$d_{ij} = \begin{cases} \|U_{ij} - X_i\| & \text{if } U_{ij} \geq X_i \\ 0 & \text{if } U_{ij} < X_i \end{cases} \quad i = 1, K \text{ and } j = 1, T \qquad \text{Eqn. (11)}$$

Step 5. Select the winning node among nodes in the competition layer for the ith design variable (i=1, K), and set the value of the output of the winning node ($Z_{ij}$) to 1.0 and remaining nodes to 0.

$$Z_{ij} = \begin{cases} 1.0 & \text{if } d_{ij} < d_{ik} \, k = 1, T \\ 0 & \text{otherwise} \end{cases} \quad i = 1, K \text{ and } j = 1, T \qquad \text{Eqn. (12)}$$

Step 6. Recall discrete cross sectional properties (for space axial-force structures, radii of gyration) based on the encoded weights of the links between the competition and interpolation layers connected to the winning node.

$$A_i = \sum_{j=1}^{T} Z_{ij} V_{j1} \ i = 1, K \qquad \text{Eqn. (13)}$$

$$r_{ni} = \sum_{j=1}^{T} Z_{ij} V_{j2} \ i = 1, K \qquad \text{Eqn. (14)}$$

$$r_{yi} = \sum_{j=1}^{T} Z_{ij} V_{j3} \ i = 1, K \qquad \text{Eqn. (15)}$$

Step 7. Calculate the nodal displacements and member stresses by a finite element analysis and find the allowable member stresses according to the AISC ASD Step 8. Calculate the outputs of nodes in the constraint layer using the following activation functions.

For stress constraint:

$$O_{cj} = r_n \max\{0, g_j(X^n)\} \text{ for } j=1, M \qquad \text{Eqn. (16)}$$

For displacement constraint:

$$O_{ck} = r_n \max\{0, g_k(X^n)\} \text{ for } k=1, N \qquad \text{Eqn. (17)}$$

By using Eqns.(16) and (17), the output will be zero when constraints are satisfied and equal to the exact value of the violation when a constraint is violated.

Step 9. Select the winning node in the constraint layer representing the most violated stress constraint among the members grouped as the ith design variable (i=1, K).

$$O_{ci} = \max\{O_{c1}, O_{c2}, ..., O_{cDi}\} \ i=1, K \qquad \text{Eqn. (18)}$$

$$O_{cj} = 0 \text{ if } j \neq i \ j=1, D_i \qquad \text{Eqn. (19)}$$

There is no competition among the nodes representing displacement constraints.

Step 10. Calculate the sensitivity coefficients for the constraints associated with winning nodes (with nonzero output) and assign them as the weights of the inhibitory connections from the constraint layer to the variable layer.

$$w_{ji} = \frac{\partial g_j(X)}{\partial X_i} = \sum_{l=1}^{D_i} \frac{g_j(X)}{\partial Y_l} \frac{\partial Y_l}{\partial X_i} \ i=1, K \ j=1, M \qquad \text{Eqn. (20)}$$

$$w_{ki} = \frac{\partial g_k(X)}{\partial X_i} = \sum_{l=1}^{D_i} \frac{g_k(X)}{\partial Y_l} \frac{\partial Y_l}{\partial X_i} \ i=1, K \ k=1, N \qquad \text{Eqn. (21)}$$

Step 11. Send the output from the nodes in the constraint layer ($O_{cj}$ and $O_{ck}$) to the nodes in the variable layer as their input. Calculate the input to the nodes in the variable layer as follows (based on Eqn. 8):

$$\dot{X}_i = -C_i - \sum_{j=1}^{K} O_{cj} w_{ji} - \sum_{k=1}^{N} O_{ck} w_{ki} \ i=1, K \qquad \text{Eqn. (22)}$$

Step 12. Calculate the output for nodes in the variable layer using the activation function at the nth iteration given as $\int \dot{X}(n-1) dt$ $$X(n) = X(n-1) + \int \dot{X}(n-1) dt \qquad \text{Eqn. (23)}$$

The improved values of design variables at the nth iteration, X(n), are calculated using the Euler method for numerical integration of the integral term in Eqn. (23).

Step 13. Check the optimization convergence of the change in the design variables by computing the following error function:

$$\Psi(n) = \sum_{i=1}^{K} \{X_i(n) - X_i(n-1)\}^2 \qquad \text{Eqn. (24)}$$

If $\psi(n) \leq \epsilon$ and outputs from the winning nodes in the constraint layer are all zero ($O_{ci}=0$ for all i=1, K), then the X(n) is the solution. Calculate the value of the original objective function (the weight of the structure), and stop. Otherwise, increase the iteration counter, n=n+1, update the penalty coefficient using $$r_n = r_0 \sqrt{n^3} \qquad \text{Eqn. (25)}$$

and go to step 4. Eqn. (25) produces stable and nonoscillating convergence.

Data Parallel Neural Dynamics Model

As noted above, a neural dynamic model for optimal design of structures may be created by integrating penalty function method, Lyapunov stability theorem, Kuhn-Tucker conditions, and the neural dynamic concept. A pseudo-objective function in the form of a Lyapunov energy functional is defined using the exterior penalty function method. The Lyapunov stability theorem guarantees that solutions of the corresponding dynamic system (trajectories) for arbitrarily given starting points approach an equilibrium point without increasing the value of the objective function. In other words, the new neural dynamic model for structural optimization problems guarantees global convergence and robustness. But, this does not guarantee the equilibrium point is a local minimum. The Kuhn-Tucker condition may be used to verify that the equilibrium point satisfies the necessary conditions for a local minimum.

In one embodiment of the present invention, the minimum weight design of large steel structures may be determined. In order to achieve automated optimum design of realistic structures subjected to actual design constraints of commonly-used design codes such as the American Institute of Steel Construction (AISC) Allowable Stress Design (ASD) and Load and Resistance Factor Design (LRFD) specifications, a hybrid counterpropagation neural (CPN) network-neural dynamic is employed for discrete optimization of such structures consisting of commercially available sections such as the wide-flange (W) shapes. Parallelism may be exploited in four stages of the nonlinear neural dynamic optimization model as applied to minimum weight design of steel structures:

mapping the continuous design variables to discrete sections using a trained counter propagation neural (CPN) network), generating the element of stiffness matrices in the local coordinates, transforming them to the global coordinates, and solving the resulting simultaneous linear equations using the preconditioned conjugate gradient (PCG) method, evaluation of the constraints based on the AISC ASD or LRFD specifications, and computation of the improved design variables from the nonlinear neural dynamic model.

Referring again to FIG. 3, the topology of the nonlinear neural dynamic model is shown. The model is comprised of four layers: a constraint layer 10, a variable layer 12, a competition layer 14, and an interpolation layer 16. The layers are interconnected by four types of connections: inhibitory recurrent connection 28, intra-layer connection 30, excitatory connection 32, and inhibitory connection 34. The number of nodes in the variable layer 12 corresponds to the number of independent design variables K in the structural optimization problem.

The design variables are the cross-sectional areas of the members. For design of steel structures, a database of cross-sectional properties is needed for computation of element stiffness matrices and evaluation of the AISC ASD or LRFD constraints. For a general space frame structure, these properties as defined in Table 1 include S=11 entities (A, $I_x$, $I_y$, $S_x$, $S_y$, $r_x$, $r_y$, $r_T$, J, $b_f$ and $d/A_f$) for the ASD code and S=13 entities (A, $I_x$, $I_y$, $S_x$, $S_y$, $r_x$, $r_y$, $C_w$, J, $Z_x$, $Z_y$, $b_f/2t_f$, and $h/t_w$) for the LRFD code. A counter propagation network consisting of competition and interpolation layers is used to learn the relationship between the cross-sectional area of a standard wide-flange (W) shape and other properties such as its radii of gyration. In other words, the trained CPN network is used as the cross-sectional properties database manager. At every design iteration, the newly computed improved values of design variables are mapped concurrently to available W shapes and their corresponding cross-sectional properties.

The recalling process in the CPN network is done in two steps. In the first step, for each design variable a competition is created among the nodes in the competition layer for selection of the winning node. The weights of the links between the variable and the competition layers represent the set of cross-sectional areas of the available standard shapes. The weight of the link connecting the winning node to the variable is the one closest to the value of the variable itself but not smaller than that. In the second step, discrete cross-sectional properties encoded in the form of weights of links between the competition and the interpolation layers are recalled. The weights of the links connecting the winning node to the nodes in the interpolation layer are the cross-sectional properties corresponding to an improved design variable.

In the second stage of the nonlinear neural dynamic model for optimal design of steel structures, element stiffness matrices are first generated in the elements' local coordinates systems and then transformed to the global coordinates system. For solution of the resulting linear simultaneous equations, direct methods are not appropriate for distributed memory computers because of their large memory requirements. Direct methods require the assembly of the structure stiffness matrix which may be very large for a structure with thousands of members. Consequently, iterative methods such as the conjugate gradient method are deemed more appropriate for distributed memory computers where the size of local memory is limited, for example, to 8 MB. Computational efficiency of the conjugate gradient method may be improved by adopting preconditioning techniques. As such, a data parallel preconditioned conjugate gradient (PCG) method may be used in a preferred embodiment of the present invention.

The third stage consists of constraint evaluation using the nodal displacements and member stresses obtained in the previous stage. For minimum weight design of steel structures, three types of constraints may be considered: fabricational, displacement, and stress (including buckling) constraints. Referring again to FIG. 3, nodes in the constraint layer 10 receive the discrete cross-sectional properties from the CPN as inputs, evaluate the prescribed constraints, and generate the magnitudes of constraint violations as outputs. The functional activations at the nodes in the variable layer 12 receive information about the search direction (encoded as the weights of the links [inhibitory connections 34] connecting the constraint layer 10 to the variable layer 12) and magnitudes of constraint violations as inputs and generate the improved design solutions as outputs.

The number of nodes in the constraint layer 10 is equal to total number of constraints imposed on the structure. There are as many constraint layers as number of loading combinations acting on the structure. Referring to FIG. 3, two constraint layers 18, 20 are shown. The number of stress constraints may be in the thousands for a large structure with thousands of members. As such, the number of violated stress constraints requiring computation of sensitivity coefficients tends to be very large. To accelerate the optimization process and reduce the required CPU time for computation of sensitivity coefficients, only the most violated constraint in each group of members linked together as one design variable is allowed to represent the status of the constraints for that group. Therefore, a competition is introduced in the constraint layer 10 to select the most critical node among the nodes belonging to one linked design variable.

For the LRFD code, the primary stress constraint for a general beam-column member is a highly nonlinear and implicit function of design variables in the following form:

$$\text{if } \frac{P_{uj}}{\phi_c P_{nj}} \geq 0.2 \quad \text{Eqn. (26)}$$

$$g_j(X) = \frac{P_{uj}}{\phi_c P_{nj}} + \frac{8}{9}\left(\frac{M_{uxj}}{\phi_b M_{nxj}} + \frac{M_{uyj}}{\phi_b M_{nyj}}\right) - 1.0 \leq 0.0$$

$$\text{if } \frac{P_{uj}}{\phi_c P_{nj}} < 0.2 \quad \text{Eqn. (27)}$$

$$g_j(X) = \frac{P_{uj}}{2\phi_c P_{nj}} + \left(\frac{M_{uxj}}{\phi_b M_{nxj}} + \frac{M_{uyj}}{\phi_b M_{nyj}}\right) - 1.0 \leq 0.0$$

where $P_{uj}$ is the required compressive strength of member j, $P_{nj}$ is the nominal compressive strength of member j, $M_{uj}$ is the required flexural strength of member j, $M_{nj}$ is the nominal flexural strength of member j, and the resistance factors for compression and flexure are $\phi_c=0.85$ and $\phi_b=0.9$, respectively. The nominal compressive and flexural strengths of a member are computed based on Chapters E and F of the AISC LRFD specifications respectively. The required flexural strength of member j is computed by considering nonlinear second order effects (requiring additional structural analyses) as follows:

$$M_{uxj} = B_{1xj}M_{ntxj} + B_{2xj}M_{1txj}$$

$$M_{uyj} = B_{1yj}M_{ntxj} + B_{2yj}M_{1txj} \quad \text{Eqn. (28)}$$

where $M_{ntj}$ is the required flexural strength in member j assuming there is no lateral translation, $M_{1tj}$ is the required flexural strength in member j due to lateral translation only, and $B_{1j}$ and $B_{2j}$ are magnification factors. $B_{1j}$ is evaluated for every beam-column and $B_{2j}$ is evaluated for each story of a building structure. For both AISC ASD and LRFD specifications, the effective length factor of a member, K, is computed by the equations presented in the European steel design code. For braced frames:

$$K = \frac{3G_A G_B + 1.4(G_A + G_B) + 0.64}{3G_A G_B + 2.0(G_A + G_B) + 1.28} \quad \text{Eqn. (29)}$$

and for unbraced frames:

$$K = \frac{1.6G_A G_B + 4.0(G_A + G_B) + 7.5}{G_A + G_B + 7.5} \quad \text{Eqn. (30)}$$

where the subscripts A and B refer to the joints at the two ends of the column under consideration. The factor G is defined as $$G = \frac{\Sigma(I_c/L_c)}{\Sigma(I_g/L_g)} \qquad \text{Eqn. (31)}$$

in which Ic is the moment of inertia and $L_c$ is the unsupported length of a column, $I_g$ is the moment inertia and $L_g$ is the unsupported length of a girder, and the summation ($\Sigma$) is over all the members connected to a joint and lying in the plane of buckling.

In the final stage, the nonlinear neural dynamic model acts as an optimizer to produce improved design variables from initial design variables. It consists of a variable layer and a number of constraint layers equal to the number of different loading conditions. The dynamic system describing how nodes activations change are described by $$\dot{X}_i = -C_i - \sum_{j=1}^{M} O_{cj}w_{ji} - \sum_{k=1}^{N} O_{ck}w_{ki} \quad i = 1, K \qquad \text{Eqn. (32)}$$

where $X_i$ is the ith design variable (cross-sectional area of the group of members i), K is the number of design variables, M is number of the members in the structure, N is the number of constrained degrees-of-freedom, $\dot{X}_i$ is the time derivative of $X_i$ and the input to the ith node in the variable layer, $C_i$ is the inhibitory recurrent connection weight of the ith node in the variable layer, $O_{cj}=r_n\max\{0, g_j(X^n)\}$ is the output of the jth node in the constraint layer (representing a member stress constraint), $O_{ck}=r_n\max\{0, g_k(X^n)\}$ is the output of the kth node in the constraint layer (representing a nodal displacement constraint), wji (i=1, K; j=1, M) is the inhibitory connection weight from the jth node in the constraint layer (representing a member stress constraint) to the ith node in the variable layer, and $w_{ki}$ (i=1, K; k=M+1, M+N) is the inhibitory connection weight from the kth node in the constraint layer (representing a nodal displacement constraint) to the ith node in the variable layer.

To derive the dynamic system represented by Eqn. (32), the pseudo-objective function is formulated by transforming the constrained optimization problem into a corresponding unconstrained optimization problem using an exterior penalty function method. The resulting pseudo-objective function is in turn transformed to a Lyapunov function by verifying the stability of the pseudo-objective function. The dynamic system (Eqn. 32) is derived by taking the derivative of the Lyapunov function with respect to time and making the value of the derivative less than or equal to zero. Therefore, the changes of node activations (the changes in the design variables) in the neural dynamic model are controlled such that the state of design variables approaches to a desirable state (a local minimum) without increasing the value of the pseudo-objective function for the structural optimization problem. The changes in the values of design variables at the nth iteration are calculated by numerical integration of Eqn. (32) using the Euler method. The improved values of design variables at the nth iteration are obtained as follows:

$$X(n)=X(n-1)+\dot{X}(n-1)dt \quad i=1, K \qquad \text{Eqn. (33)}$$

Connection Machine CM-5 Architecture

A preferred embodiment of the present invention may be developed to operate on a massively parallel computer such as the CONNECTION MACHINE CM-5. The present invention is not, however, limited to any particular operating environment. Those skilled in the art will find that the methods of the present invention may operate in a variety of environments (e.g., Encore Multimax or Cray YMP8/864). The description of the present invention in relation to an implementation for the CM-5 is illustrative only.

Figure 4:
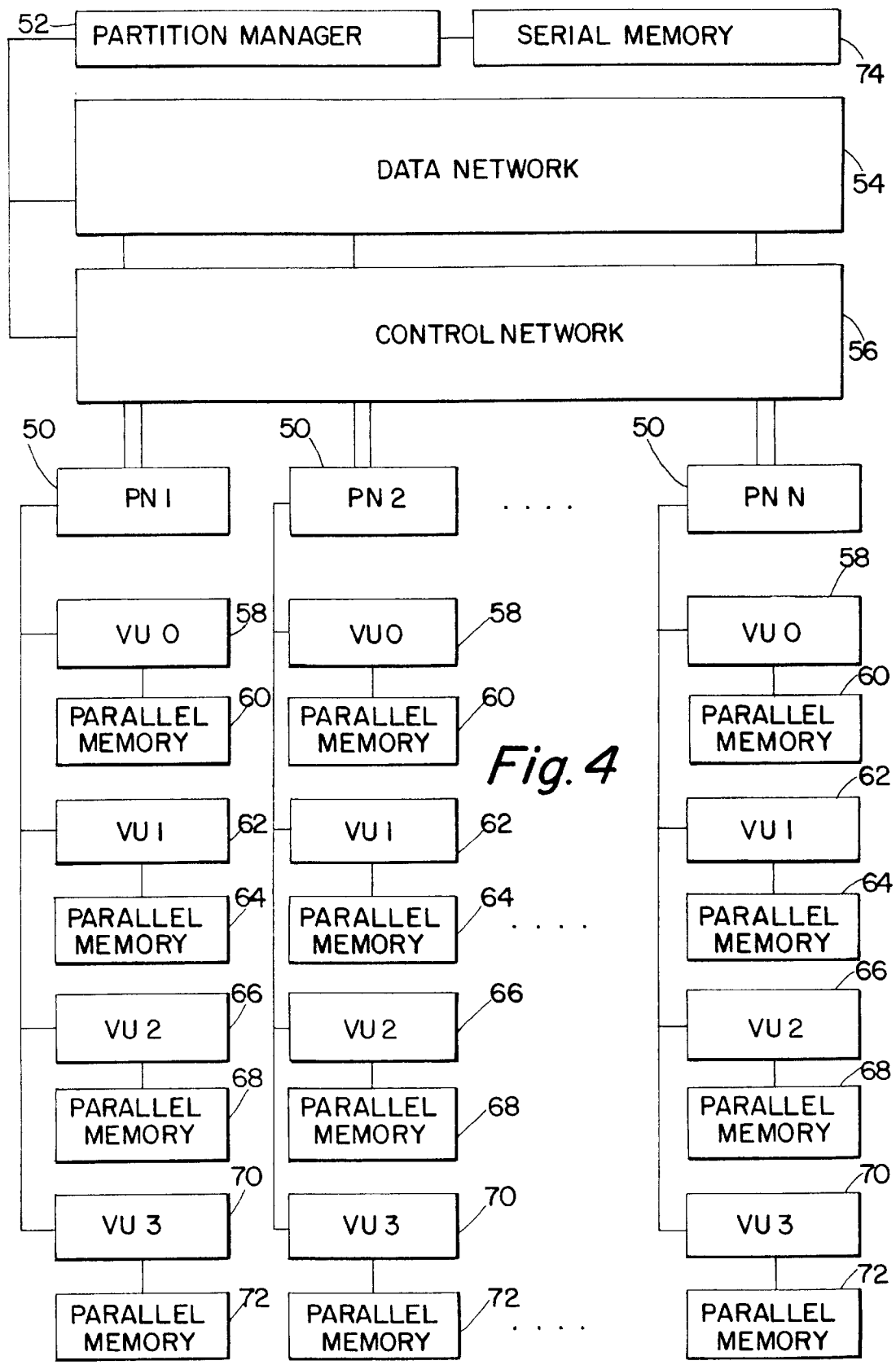
FIG. 4 is a system organization diagram for a CM-5 computer used in accordance with a preferred embodiment of the present invention.

Referring to FIG. 4, the main components of the CM-5 system are a number of processing nodes (PN) 50, partition manager (PM) 52, and two high-speed, high-bandwidth communication networks called data and control networks 54, 56. A PN 50 has four vector units (identified as VU0 58, VU1 62, VU2 66, VU3 70) with a total of 32 MB of memory (8 MB per VU 60, 64, 68, 72) and can perform high-speed vector arithmetic computations with a theoretical peak performance of 128 MFLOPS. A VU 58, 62, 66, 60 is the smallest computational element (processing element, PE) in the system which executes vector operations on data in its own local (parallel) memory 60, 64, 68, 72. A $2^n$(n=5, 6, 7, 8, 9) number of PNs (32, 64, 128, 256, 512) are controlled by a partition manager 52. In one embodiment of the CM-5 system, a PM has 64 MB of serial memory and manages up to 2048 distributed PEs. Global communication operations involving all processors such as global summation or global synchronization are done via the control network 56. Data network 54 is used for local communications (point-to-point exchange of data) between individual PNs.

Data on the CM-5 are divided into two classes: scalar (or serial) and parallel. Scalar data is stored in a PM memory 74 and operated on serially by the PM. Operations involved in scalar or serial arrays are minimized in order to achieve high parallel processing performance. Parallel data are distributed across parallel memories of VUs 60, 64, 68, 72. The performance of a data parallel algorithm depends highly on the parallel data distribution method. Preferably, parallel data is distributed so that all PEs may work on data located in their own memory without any communication. A block distribution with detailed array layout may be used to distribute parallel data. In the block distribution, an array is divided into equal size blocks (the size of a block is specified in the array layout directive) and each block is assigned to one PE.

The programming language CM FORTRAN uses array processing features of FORTRAN 90 to express data parallel algorithm. Array operations on a single array or array section (subset of an array) are processed concurrently on elements of the array allocated to the local VU memories 60, 64, 68, 72. Array operations involving more than two arrays or array sections may be done efficiently without inter-processor communications only when corresponding elements of arrays are stored in the memory of the same VU (called conformable arrays). Two arrays are conformable when their dimensions and lengths are the same. For example, given two conformable one dimensional arrays $X_1(2048)$ and $Y_1(2048)$ with 2048 elements, the multiplication operation $(X_1*Y_1)$ may be done simultaneously in one step on 2048 VUs where each VU performs only one multiplication without any communication among VUs. Preferably, for any given problem a data parallel algorithm is developed and the corresponding data structures appropriate for the CM-5 data parallel architecture are developed.

Data Parallel Algorithms and Data Structures

In accordance with a preferred embodiment of the present invention, four data parallel structures and algorithms are developed for the illustrative problem of optimal design of steel structures. The first one is for recalling the cross-sectional properties of the available standard shapes. The second one is for the PCG method used for the solution of the linear simultaneous equations. The third one is for evaluation of the AISC ASD or LRFD code constraints. The last one is for the operation of the neural dynamic network.

Recalling Cross-Sectional Properties of the Available Standard Shapes

For each design variable $X_i$ (i=1, K), a competition is created to select the winning node in the competition layer. The competition is processed by using the Euclidean distances between the ith design variable and the weights of the links connecting the ith design variable and the T nodes in the competition layer, $U_{ij}$, as follows:

$$d_{ij}=\|U_{ij}-X_i\|+0_{ij} \text{ for } j=1, T \qquad \text{Eqn. (34)}$$

where T is the number of available W shapes and $0_j$ is set to a large number greater than the maximum Euclidean distance (for example, $10^5$) if $U_{ij} < X_i$, otherwise $O_{ij}=0$. This penalty term, is adopted to select the winning node such that the value of the connection weight for the link connecting the ith design variable to the winning node is close, but greater than or equal to the value of the ith design variable (to prevent the possible deterioration of feasibility of the design solution at the given design iteration). Based on the Euclidean distances, the winning node is selected and the output of the winning node for the ith design variable ($Z_{ij}$) is set to 1.0 and those of the remaining nodes to 0:

$$Z_{ij} = \begin{cases} 1.0 & \text{if } d_{ij} < d_{ik} \, k=1, T \\ 0 & \text{otherwise} \end{cases} \quad i=1, K \text{ and } j=1, T \qquad \text{Eqn. (35)}$$

K competitions (the number of design variables) are required at each design iteration. To perform K competitions concurrently, K design variables are divided into the same number of groups as the number of available PEs ($N_p$). Therefore, each PE stores roughly $N_1 = K/N_p$ (rounded up to the next integer) design variables and executes approximately the same number of competitions concurrently. However, each competition involves computations of the Euclidean distances between the value of a design variable and all the connection weights ($U_{ij}$, j=1, T) because a W shape needs to be assigned to each design variable with its corresponding cross-sectional properties from a given set of W shapes. In other words, the competition for a design variable requires inter-processor communications between the PE where the design variable is allocated and the PEs where cross-sectional properties of the set of W shapes are stored.

For any given $X_i$, the discrete cross-sectional properties stored in the form of weights of links connecting the competition and interpolation layers, $V_{jk}$(j=1, T; k=1, S), are recalled based on the output of the competition layer:

$$Y_{ik} = \sum_{j=1}^{T} Z_{ij} V_{jk} \, i=1, K \text{ and } k=1, S \qquad \text{Eqn. (36)}$$

where $Y_{ik}$ is the kth cross-sectional property of the W shape corresponding to the ith design variable and S is the number of nodes in the interpolation layer (number of required cross-sectional properties for each member).

Referring to FIG. 5, in order to reduce the communication cost, private copies of $U_{ij}$ and $V_{jk}$ 82 are broadcasted to each PE 80 which creates a small initial overhead. Each PE 80, in turn, performs $N_1$ competition (Eqns. 34 and 35) and recalling (Eqn. 36) processes concurrently without communications among PEs. With all the required data on the local memories of PEs, the recalling process is performed concurrently without inter-processor communications. The data parallel algorithm for recalling the cross-sectional properties may be summarized as follows:

step 1. Broadcast private copies of U(1:K, 1:T) and V(1:T, 1:S) to the PEs where the design variables are allocated.

(Each PE executes roughly $N_1$ operations concurrently in the remaining steps 2 to 5)

step 2. Calculate the Euclidean distances, d(1:K, 1:T) between the design variables X(1:K) and the connection weights U(1:K, 1:T).

$$d(1:K,1:T)=\|U(1:K,1:T)-X(1:K)\| \qquad \text{Eqn. (37)}$$

step 3. Set the values of 0(1:K, 1:T) and calculate the modified Euclidean distances, d(1:K, 1:T):

where $$U(1:K,1:T)-X(1:K)<0$$

$$0(1:K,1:T)=10^5$$

else where $$0(1:K,1:T)=0$$

end where $$d(1K,1:T)=d(1:K,1:T)+0(1:K,1:T) \qquad \text{Eqn. (38)}$$

step 4. Select the winning nodes based on the modified Euclidean distances, and set the outputs of the winning nodes, Z(i=1:Kj=1:T), to 1.0 and remaining nodes to 0.

$$Z(i=1:K,j) = \begin{cases} 1.0 & \text{if } d(i=1:K,j) = \min\{d(i=1:K,1),\ldots, \\ & \qquad d(i=1:K,T)\} \\ 0 & \text{otherwise} \end{cases} \qquad \text{Eqn. (39)}$$

step 5. Recall S discrete cross-sectional properties (S=11 for ASD and S=13 for LRFD) based on the encoded weights V(j=1: T,k=1,S):

$$Y(i=1:K, k=1:S) = \sum_{j=1}^{T} Z(i=1:K,j)V(j, k=1:S) \qquad \text{Eqn. (40)}$$

Preconditioned Conjugate Gradient Method

A data parallel PCG method is presented with an appropriate data structure for the solution of linear equilibrium equations resulting from a finite element analysis of the structure. Two levels of parallelisms are exploited: structural elements level and degrees-of-freedom level. Each structural member and each degree-of-freedom is assigned to a VU explicitly.

For concurrent generation of element stiffness matrices, each element stiffness matrix of a framed structure containing $2N_2 \times 2N_2$ components ($N_2$=degrees-of-freedom per node) is assigned to a VU. These element stiffness matrices are stored uniformly across memories of VUs in the form of a three dimensional unassembled global stiffness matrix K(2N2,2N2,M) (in the global coordinates) with the detailed array layout K (:serial,:serial,:block=$N_m$:procs=$N_p$) where :serial directives lay out all the components of the specified dimensions of the array in the memory of a single PE, :block directive specified the number of components to be assigned to each PE, and :procs directive specifies the number of PEs to be used for the array. $N_m = M/N_p$ (rounded up to the next integer) is roughly the number of members assigned to each PE. To overcome the problem of limited local memory of a single PE, (e.g., 8 MB per PE in the CM-5 computing environment,) element stiffness matrices are distributed on the memories of PEs without explicit assembly of the global structure stiffness matrix. Furthermore, this data distribution mechanism ensures efficient load balancing of PEs because each PE generates roughly an equal number ($N_m$) of element stiffness matrices using the cross-sectional properties stored in its own local memory.

A diagonal preconditioner is created by assembling the diagonal elements of element stiffness matrices according to the nodal displacement connectivity matrix in order to accelerate the search process in the conjugate gradient method. The diagonal preconditioner is transformed into a vector with a length $N_2XN_j$ ($N_j$=total number of joints in a structure). The major advantage of adopting the diagonal preconditioner is that its inverse can be computed easily. All the data required during the PCG iterations are presented in the form of vectors with the same length as the preconditioner, except for the element stiffness matrices that are defined as three dimensional matrices as explained before. They consist of nodal load, displacement, residual or error (P−Ku) and search direction vectors. Each degree-of-freedom is assigned to a VU. Consequently, $N_d(=N_2XN_j)/N_p$ rounded up to the next integer is roughly the number of degrees-of-freedom assigned to each VU.

The major computations required for the PCG algorithm consist of basic linear algebra operations such as matrix-vector multiplications, dot products, scalar-vector multiplications, and vector additions. All vectors involved in the basic operations have the same data structure, a degree-of-freedom per VU. Thus, the latter two operations are executed concurrently without any inter-processor communication. However, communications are involved in both matrix-vector multiplications and dot products. Communication overhead involved in dot product operations, performed through the fast control network in the CM-5 system, is negligible compared to that of matrix-vector multiplications. A matrix-vector multiplication is required between the unassembled global stiffness matrix K and the search direction vector p for computation of the search step size.

In general, communication involved in the matrix-vector multiplications is unavoidable on distributed memory computer because the length and dimensions of the matrix and the vector are different. In accordance with a preferred embodiment of the data parallel algorithm, the matrix K is distributed at element level and the vector p is distributed at nodal degree-of-freedom level. The matrix-vector multiplication is parallelized at element level by transforming the direction vector p into an element level direction matrix in the form of two dimensional array ptemp($2N_2$,M) which is conformable with the unassembled global stiffness matrix K. This operation is performed by the sparse gather utility library function in the Connection Machine Scientific Software Library (CMSSL) using the nodal displacement connectivity matrix IDJ($2N_2$,M). As a result of the multiplication, the two dimensional matrix vtemp($2N_2$,M) —which is needed for dot products in the remaining steps of the PCG algorithm—may be obtained. Then, the two dimensional array vtemp is transformed to a vector v($N_d$) by the sparse scatter utility in the CMSSL. The sparse gather/scatter operations are performed in three steps: set up the gather/scatter operation, perform the gather/scatter operation, and deallocate the required storage space. Once routines for gather/scatter operations are setup, gather or scatter operations may be called more than once without calling the setup routines again. As such, communication cost is reduced in the matrix-vector multiplication. The PCG algorithm parallelized at element and nodal degree-of-freedom levels is given as follows:

step 1. Set up the diagonal preconditioner (D) using the nodal displacement connectivity matrix IDJ($2N_2$,M), and lay out its elements across the local memories of PEs by a degree-of-freedom per PE.

(In steps 2 and 3, each PE executes roughly $N_d/N_p$ (rounded up to the next integer) operations concurrently).

step 2. Calculate the initial residual (error) vector ($r_0$) and use it as initial search direction vector ($p_0$), and compute the temporary vector $z_0$ and the initial value of the scaler p concurrently at the degree-of-freedom level using a starting nodal displacement vector ($u_0$).

$$r_0(1:N_d)=P(1:N_d)-K(2N_2, 2N_2, M)u_0(1:N_d) \qquad \text{Eqn. (41)}$$

$$p_0(1:N_d)=r_0(1:N_d), \qquad \text{Eqn. (42)}$$

$$z_0(1:N_d)=D^{-1}(1:N_d)r_0(1:N_d), \text{ and} \qquad \text{Eqn. (43)}$$

$$\rho=z^T_0(1:N_d)\cdot r_0(1:N_d) \qquad \text{Eqn. (44)}$$

step 3. Check the convergence of the PCG algorithm using the norm of the residual (error) vector, $\|r\|$. If $\|r\|<$, then u is the nodal displacement vector, and stop. Otherwise do the following steps.

(In steps 4 to 6, each PE executes $N_m$ operations concurrently:)

step 4. Transform the direction vector into a temporary two dimensional matrix using the gather operation and the nodal displacement connectivity matrix IDJ($2N_2$,M). Gather [ptemp,p]

step 5. Do the concurrent matrix-matrix multiplications at element level.

$$vtemp(2N_2,M)=K(2N_2,2N_2,M)ptemp(2N_2,M)$$

6. Transform the matrix ptemp into the vector v using the connectivity matrix IDJ($2N_2$,M) and the scatter operation.

$$scatter[v(vd),ptemp(2N_2,M)]$$

(Each PE executes roughly $N_d/N_p$ (rounded up to the next integer) operations concurrently in the remaining steps.)

step 7. Compute the step size for the search direction, $\gamma=p/\alpha$, where $\alpha=p^T(N_d)\cdot v(N_d)$ step 8. Compute the improved nodal displacement vector.

$$u(1:N_d)=u(1:N_d)+\gamma p(1:N_d)$$

step 9. Calculate the new residual vector.

$$r(1:N_d)=r(1:N_d)+\gamma p(1:N_d)$$

step 10. Compute new search direction vector.

$$p(1:N_d)=z(1:N_d)+\beta p(1:N_d)$$

$$z(1:N_d)=M^{-1}(1:N_d)r(1:N_d)$$

$$\rho=z(N_d)^T\cdot r(N_d)]$$

$$\beta=\rho_i/\rho_{i-1}$$

Go to step 3

Constraint Evaluation

For integrated design of steel structures, three different kinds of constraints may be considered in the formulation of the structural optimization problems: fabricational, displacement, and stress constraints. Displacement constraints may be evaluated directly using the nodal displacement vector from the PCG solver. Stress constraints may be based on the AISC ASD or LRFD specifications.

Constraints evaluation requires cross-sectional properties of W shapes used for members in a structure. They may be obtained from the trained CPN as described previously. The cross-sectional properties are distributed element-wise such that all cross-sectional properties for a member reside in the memory of a single VU. $N_m$ allowable member stresses for the ASD code or nominal member strengths for the LRFD code are computed on each single VU. Thus, the computations related to constraints evaluation may be processed concurrently at the element level without any interprocessor communication.

Operation of the Neural Dynamic Network

In a neural network model, the input to a node is calculated by the weighted sum of outputs from the nodes in the previous layer. In model of the present invention, the input to the ith node in the variable layer is the sum of three terms (Eqn. 32): the inhibitory recurrent connection weight of the ith node in the variable layer, $C_i$, the weighted sum of outputs from the nodes representing nodal displacement constraints in the constraint layer, $\Sigma^M_{j=1} O_{cj} w_{ji}$, and the weighted sum of outputs from the nodes representing member stress constraints in the constraint layer, $\Sigma^N_{k=1} O_{ck} w_{ki}$.

In the neural dynamic system of the present invention, the computation of the inputs to the nodes in the variable layer (Eqn. 32) are parallelized at both network node (neuron) and weight levels. For the node level parallelism, a node in each layer is assigned to a PE. In turn, each PE computes roughly $N_3 = (M+N)/N_p$ and $N_1 = K/N_p$ (rounded up to the next integer) outputs of the nodes in the constraint and variable layers, respectively, operated concurrently without any interprocessor communication.

For the computations of inputs to the nodes in the variable layer, in order to distribute the loads among VUs as evenly as possible each column of the matrix representing the connection weights, wji(j=1:M+N, i=$i_1$), between node i1 in the variable layer and all the nodes in the constraint layer (j=1, M+N) is mapped to a VU. Each VU stores roughly $N_1$ columns of the weight matrix, w. The connection weights, $C_i$(i=1:K), are distributed the same way as the nodes in the variable layer. However, evaluations of the second and third input terms in Eqn. (32) require inter-processor communications because each column of the matrix w is multiplied by the vectors of outputs from the nodes in the constraint layer ($O_{cj}$ and $O_{ck}$) (matrix-vector multiplication). Preferably, to reduce the communication cost, private copies of $O_{cj}$ and $O_{ck}$ are broadcasted to PEs where the columns of the connection weight matrix reside.

The computations of inputs to the nodes in the variable layer are parallelized at both node (neuron) and weight level as follows:

step 1. Broadcast private copies of $O_{cj}$ and $O_{ck}$ to the PEs where the columns of the connection weight matrix are allocated.

(Each PE executes roughly $N_1$ operations concurrently in the remaining steps).

step 2. Calculate the weighted sum of outputs from the nodes in the constraint layer (concurrent processing at node and weight levels)

$$\dot{X}(1:K) = -\sum_{j=1}^{M} O_c(j) w(j, 1:K) - \sum_{k=1}^{N} O_c(k) w(k, 1:K) \quad \text{Eqn. (45)}$$

step 3. Calculate the inputs to the nodes in the variable layer (concurrent processing at node level)

$$\dot{X}(1:K) = \dot{X}(1:K) - C(1:K) \quad \text{Eqn. (46)}$$

step 4. Calculate the outputs of the nodes in the variable layer (improved values of the design variables) by numerical integration (concurrent processing at node level).

$$X(1:K) = X(1:K) + l\dot{X}(1:K) \quad \text{Eqn. (47)}$$

Figure 6A:
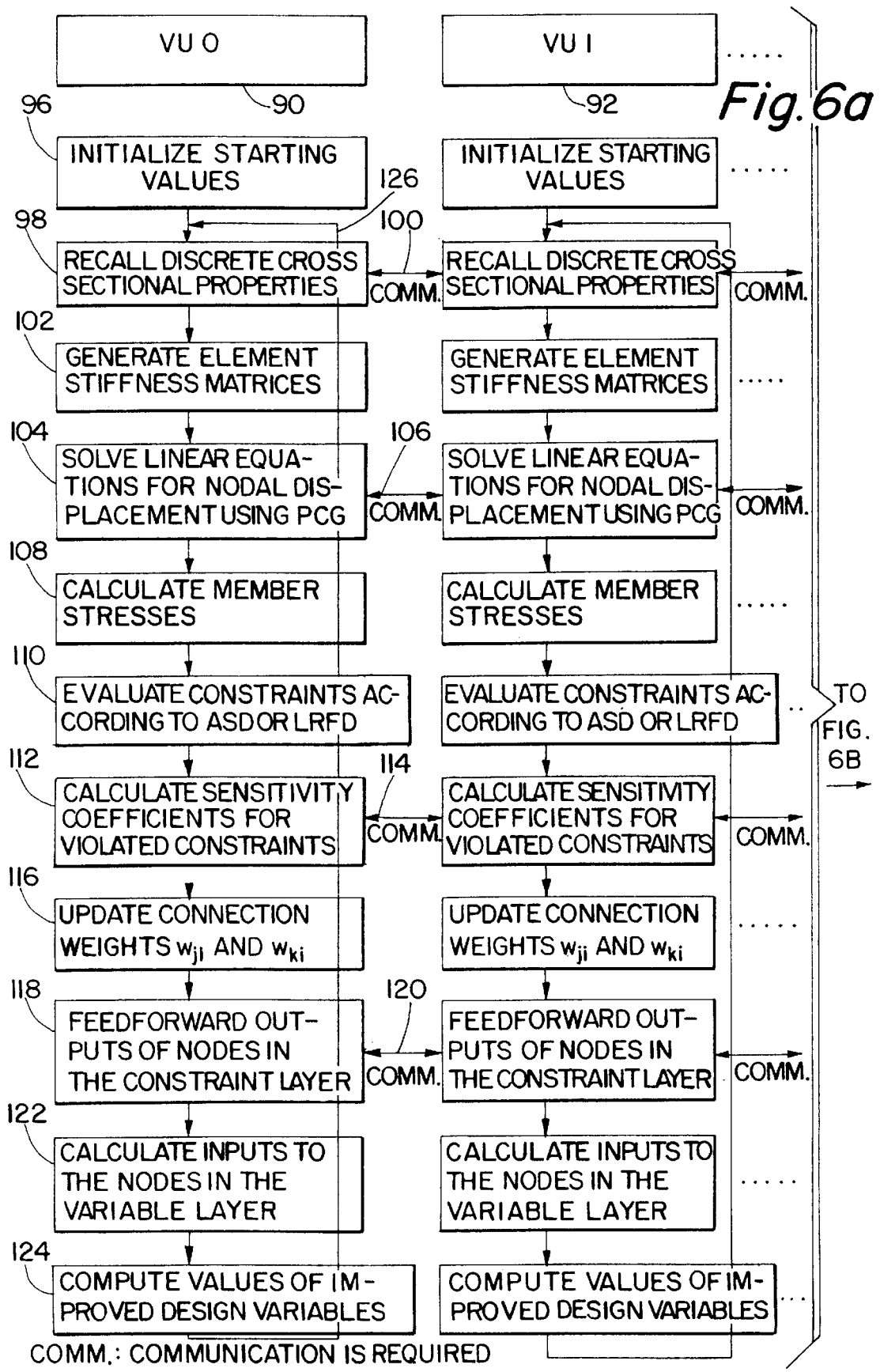

Referring to FIGS. 6a and 6b, a flow diagram of a preferred embodiment of the present invention is presented. FIGS. 6a and 6b illustrate the method of the present invention for a preferred embodiment and illustrate communications between VUs that occur during processing. As shown in FIGS. 6a and 6b, a series of operations are performed on data within each VU 90, 92, 94. The operations described in FIGS. 6a and 6b correspond to the stages described earlier. In Stage 1—Mapping Continuous Design Variables, starting values are initialized 96 and discrete cross-sectional properties are recalled 98. Following the completion of Stage 1, processing results are communicated across VUs 100 so the next processing stage may begin. In Stage 2—Generating Element Stiffness Matrices, element stiffness matrices are determined 102 and linear equations for nodal displacement are solved 104, preferably, using PCG. Processing results are then communicated across VUs 106. In Stage 3—Constraint Evaluation, member stresses are calculated 108, constraints are evaluated according to known specifications 110, and sensitivity coefficients are calculated for violated constraints 112. Processing results are then communicated across VUs 114. In Stage 4, connection weights are updated 116 and outputs of nodes in the constraint layer are determined 118 and communicated across VUs using a feedforward mechanism 120. Finally, inputs to nodes in the variable layer of the neural network are calculated 122 and values of improved design variables are computed 124. Processing continues until convergence occurs 126.

As may be apparent, the present invention may be embodied in a computer program stored on magnetic media such as a hard disk drive or tape or another type of media. Neural network architectures and programming methods are well-known to those of ordinary skill in the art.

EXAMPLES

Application of the present invention to the minimum weight design of large steel structures illustrate the benefits and advantages of the present invention. As will be apparent from the examples, the method of the present invention may be applied to steel structures of arbitrary size and configuration. Examples 1 and 3 are space moment resisting frames with cross bracings. Example 2 is a space axial-load (truss) structure. The modulus of elasticity of steel is E=198.91 Gpa (29000 ksi) and the specific weight is p=76.97 kN/m$^3$ (490 lb/ft$^3$). Yield stress of $F_y$=344.75 MPa (50 ksi) is used for all examples.

Example 1

Figure 7:
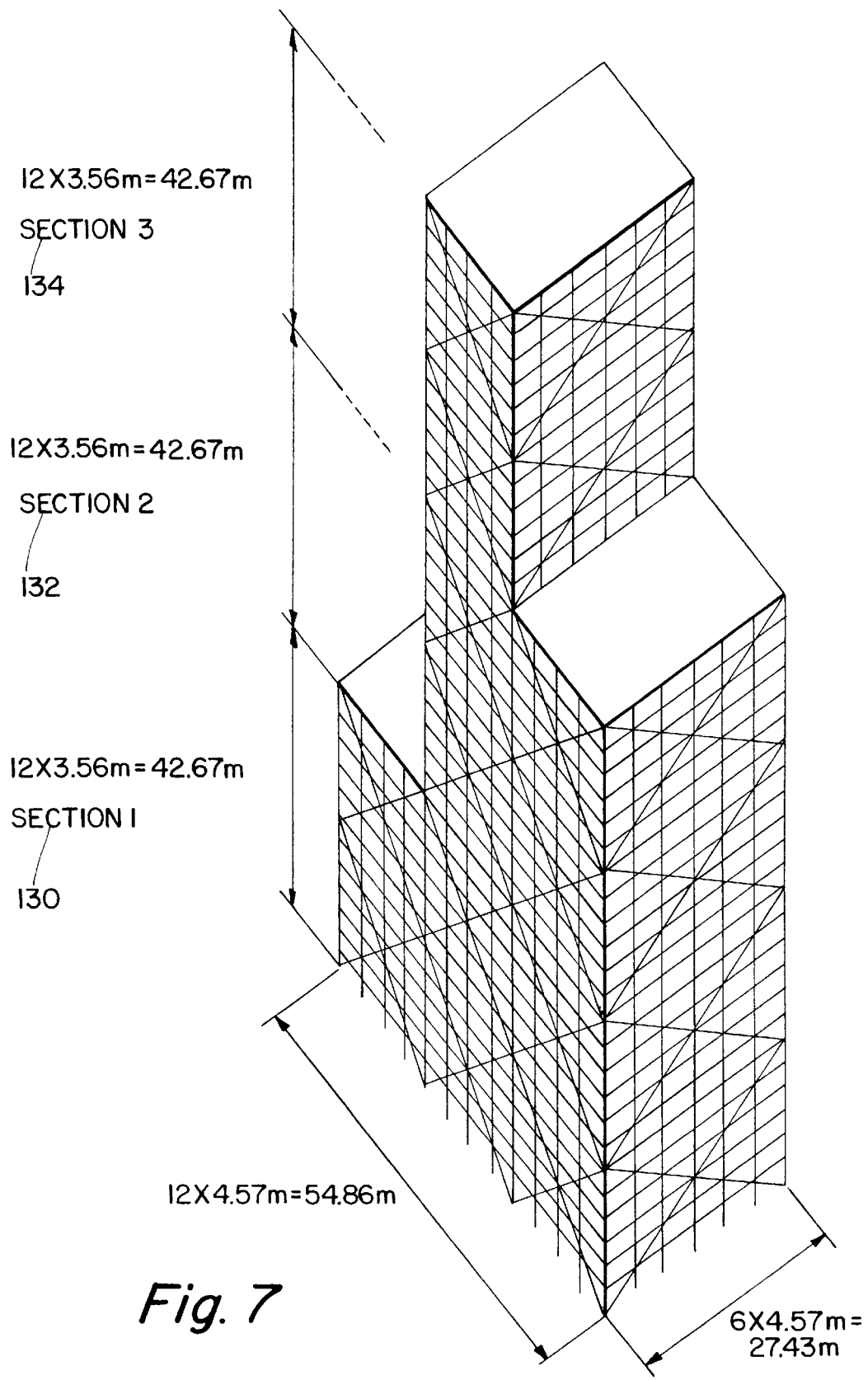
FIG. 7 is an illustration of a first building structure designed in accordance with a preferred embodiment of the present invention.
Figure 8:
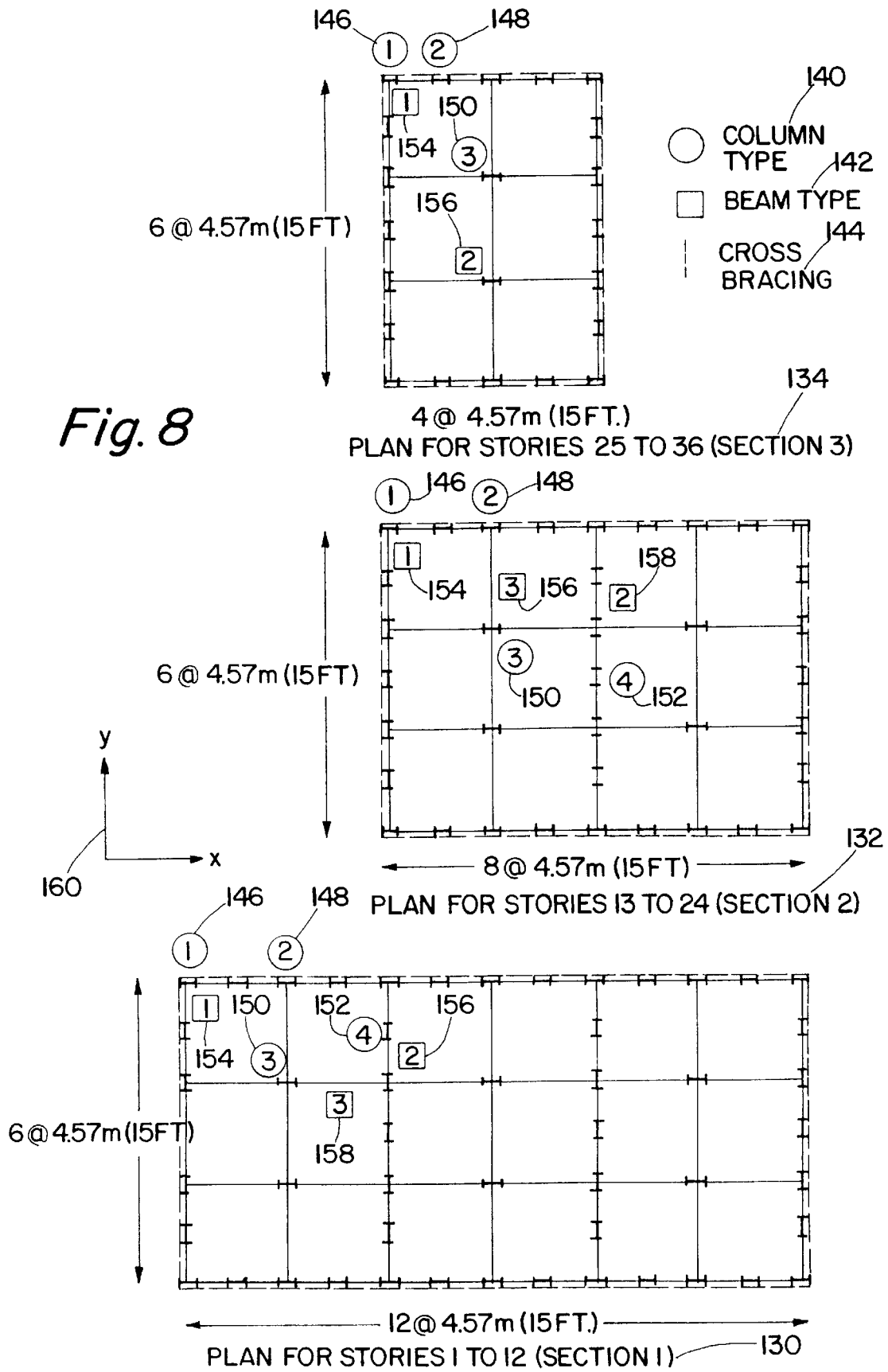
FIG. 8 is a floor plan of the building structure of FIG. 7.

Referring to FIG. 7, this example is a 36-story irregular steel-moment-resisting space frame with setbacks and cross bracings. The structure has 1384 nodes and an aspect ratio of 4.7. The 3228 members of the structure are divided into 186 groups. The structure is divided into three 12-story sections 130, 132, 134 as indicated in FIG. 7. Referring to FIG. 8, in sections 1 (130) and 2 (132) of the structure, four different types of columns are used in every two stories as follows: corner columns 146, outer columns 148, inner columns in unbraced frames 150, and inner columns in braced frames 152. In section 3, there are only the first three different types of columns 146, 148, 150. In section 1 and 2, the beams of each story are divided into 3 groups: outer beams 154, inner beams in braced frames 156, and inner beams in unbraced frames 158. In section 3, there are only the first two types of beams 154, 156. Two different types of bracings are used in every three stories: one type in the longitudinal and another type in the transverse direction.

For displacement constraints, the interstory drift is limited to 0.004 times the story height in x and y directions 160. The loading on the structure consists of dead load of 2.88 kPa 60 (psf), live load 2.38 kPa of (50 psf), and roof live load of 2.38 kPa (50 psf). The lateral loads due to wind are computed according to the Uniform Building Code (UBC) (1994). Lateral forces are determined by assuming a basic wind speed of 113 km/h (70 mph), exposure C (generally open area), and importance factor of 1.

Figure 9:
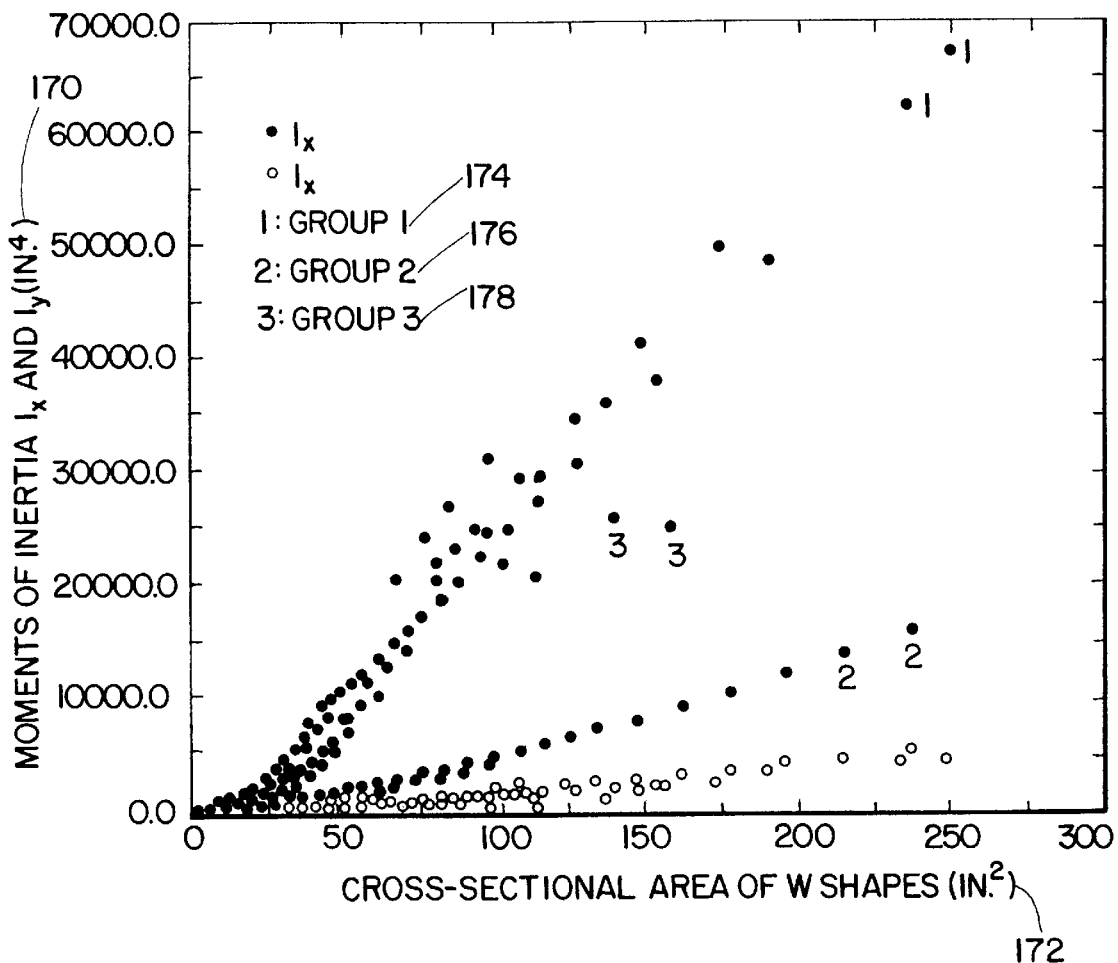
FIG. 9 is an illustration of the relationships between the cross-sectional area and moments of inertia for commercially available steel I shapes.
Figure 10:
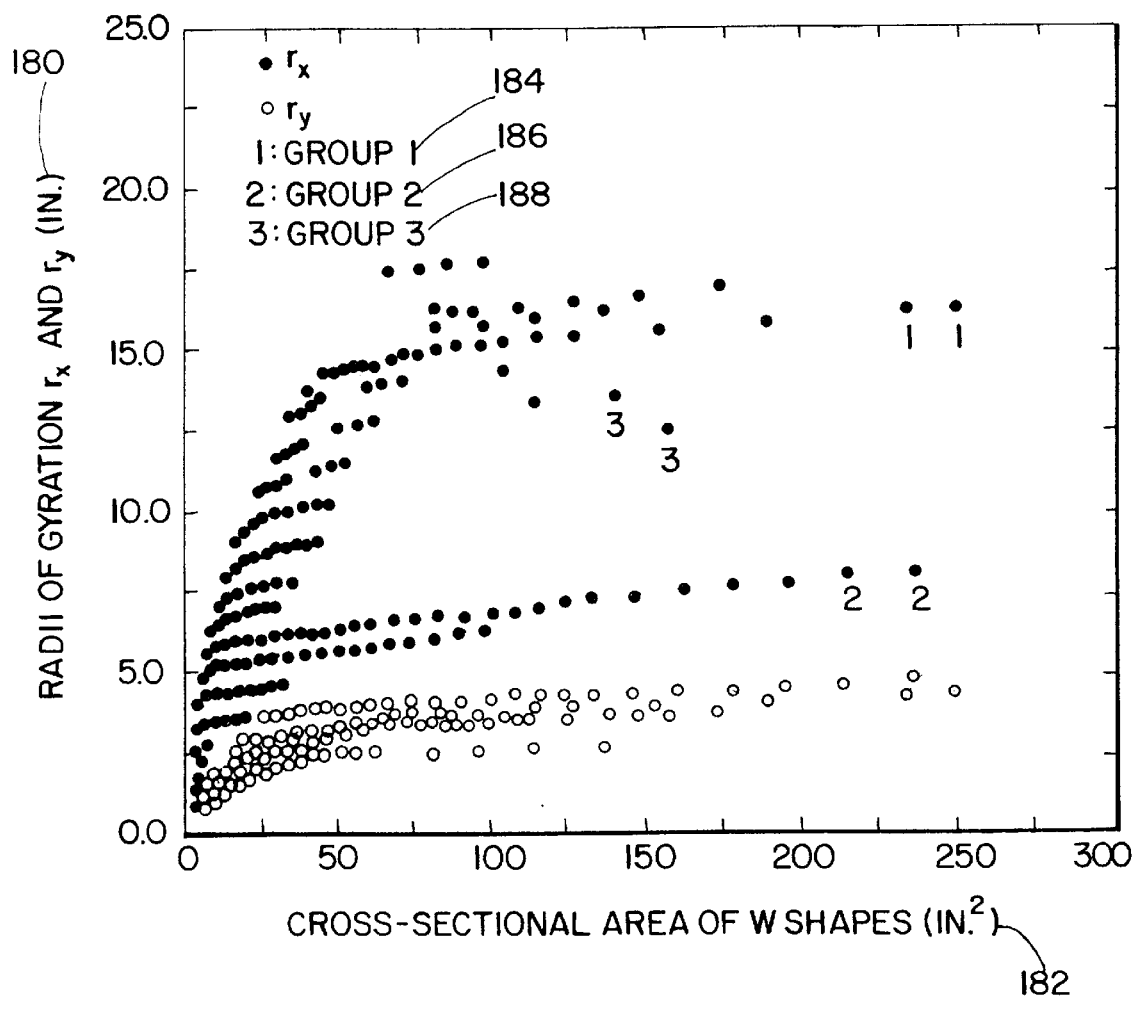
FIG. 10 is an illustration of the relationships between the cross-sectional area and radii of gyration for commercially available steel I shapes.

There are 295 W shapes in the AISC LRFD manual. Not all are considered economical shapes as beam and column members used in high-rise building structures. Broadly speaking, suitable W shapes for beam members are those with large moment of inertia $I_x$, and suitable W shapes for columns are those with radii of gyrations $r_x$ and $r_y$ close to each other. FIG. 9 shows the relationships between the moments of inertia $I_x$ and $I_y$ 170 and the cross-sectional area of the 295 W shapes 172 available in the AISC LRFD specification. FIG. 10 shows similar relationships between the radii of gyrations $r_x$ and $r_y$ 180 and the cross-sectional area 182.

Three trends may be observed in FIGS. 9 and 10. For one group of W shapes (identified by 1 in FIGS. 9 (174) and 10 (184)), the moment of inertia with respect to the major axis, $I_x$ (or radius of gyration, $r_x$) is substantially larger than the moment of inertia with respect to the minor axis, $I_y$ (or radius of gyration, $r_y$). These W shapes are suitable as beam members. For the second group of W shapes (identified as 2 in FIGS. 9 (176) and 10 (186)), $I_x$ and $I_y$ (or $r_x$ and $r_y$) values are relatively close to each other. The third group of W shapes fall in between (identified by 3 in FIGS. 9 (178) and 10 (188)). Preferably, the third group of W shapes and those with cross-sectional area less than 32.3 cm² (5 in.²) are deleted from the sections database. One hundred sixty-two (162) W shapes from the first group may be chosen as potentially economical beam sections and 58 W shapes from the second group may be chosen as potentially economical column sections.

The lower bounds for column/bracing and beam members are 35.7 cm² (5.54 in.²) and 33.9 cm² (5.26 in.²), respectively. The upper bounds for column/bracing and beam members are 1529.0 cm² (237.0 in.²) and 1606.4 cm² (249.0 in.²), respectively.

Figure 11:
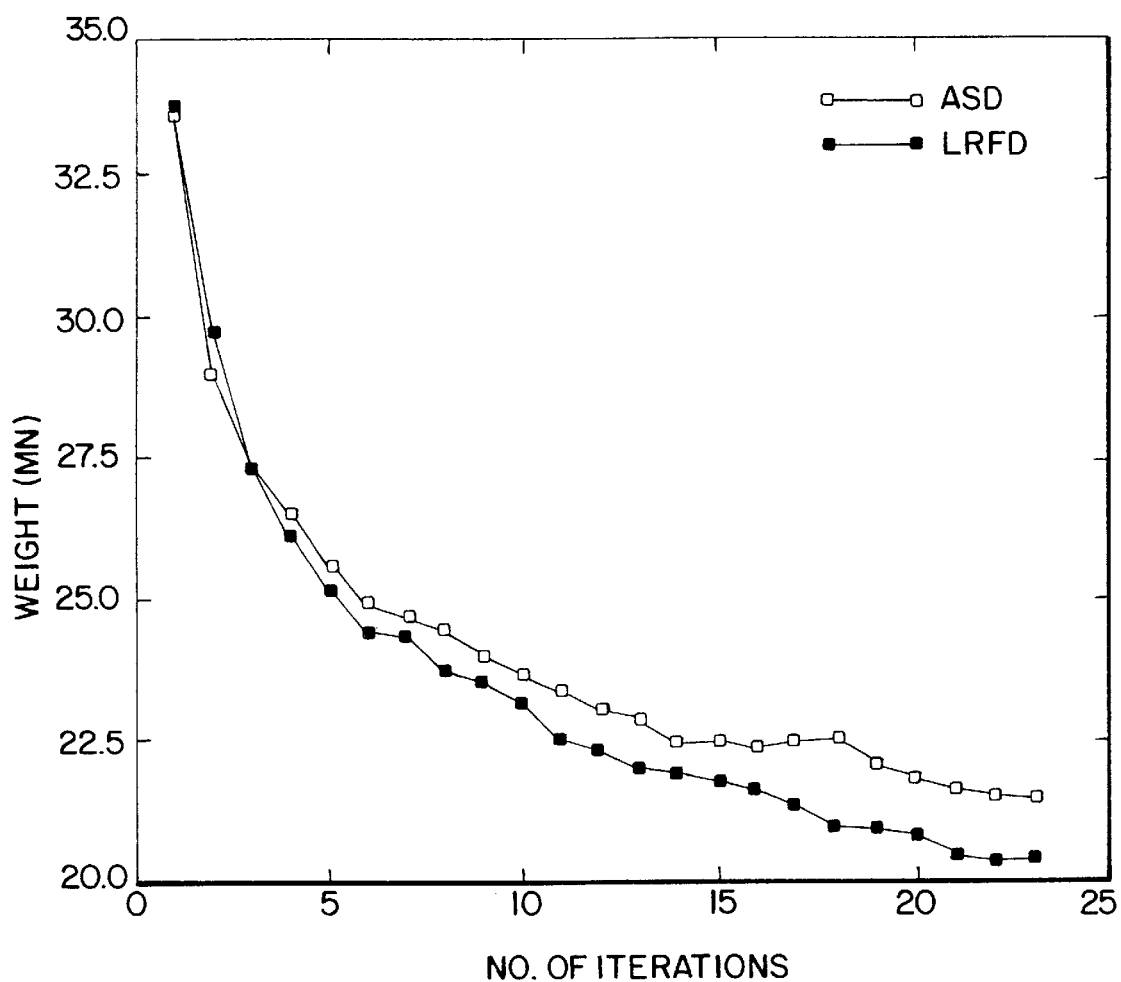
FIG. 11 is the convergence history for the automated design of the building structure of FIG. 7 in accordance with a preferred embodiment of the present invention.

The convergence histories for designs based on AISC ASD and LRFD codes are shown in FIG. 11. Minimum weights of 21.51 MN (4836.6 kips) and 20.34 MN (4573.5 kips) are obtained using the ASD and LRFD codes, respectively. These translate into 0.59 kPa (12.44 psf) and 0.56 kPa (11.76 psf) for ASD and LRFD codes, respectively, when the total weight of the structure is divided by the total floor area provided by the structure. The minimum weight design based on the LRFD code is 5.4% lighter than that based on the ASD code.

Example 2

Figure 12:
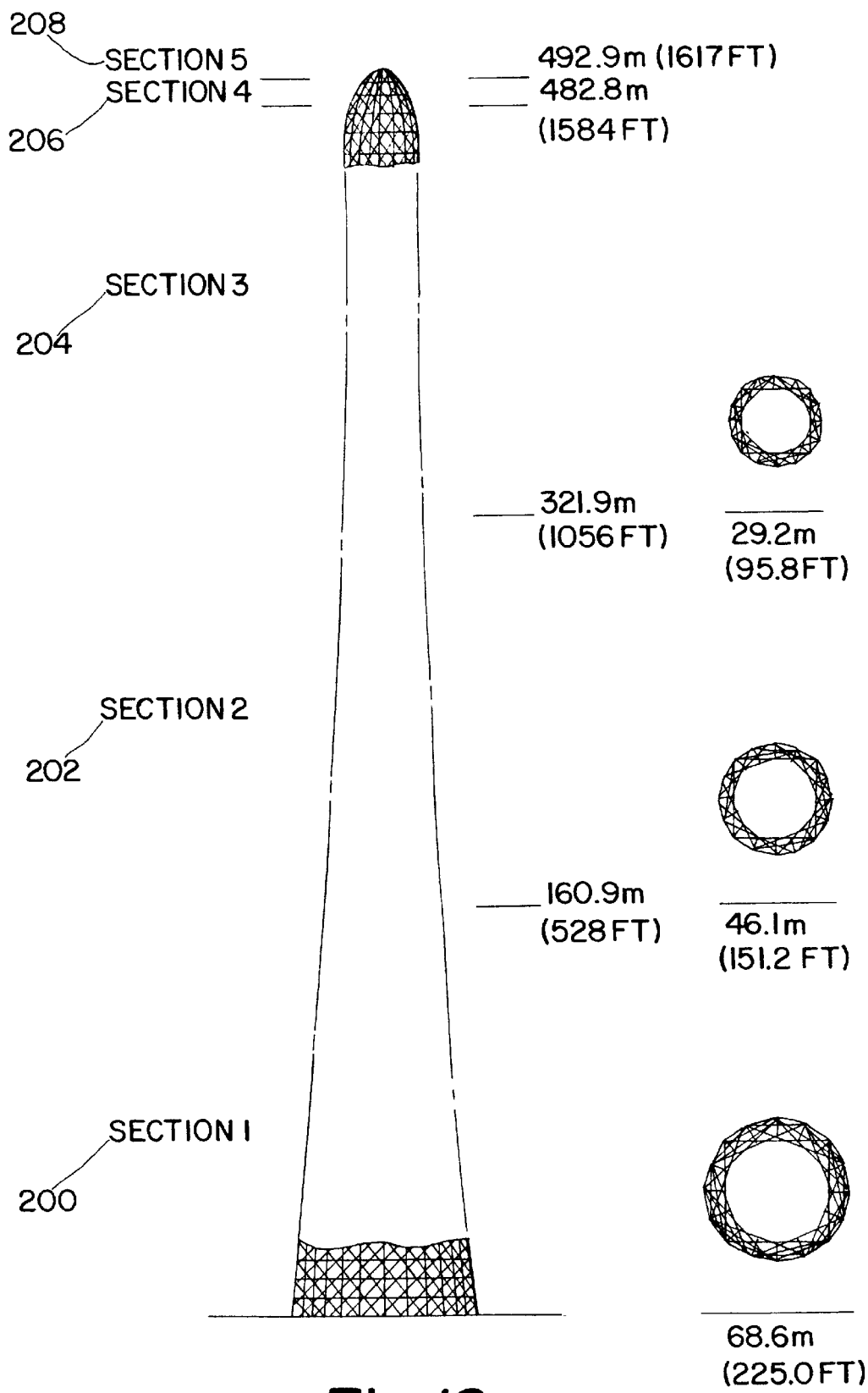
FIG. 12 is an illustration of a second building structure designed in accordance with a preferred embodiment of the present invention.
Figure 13A:
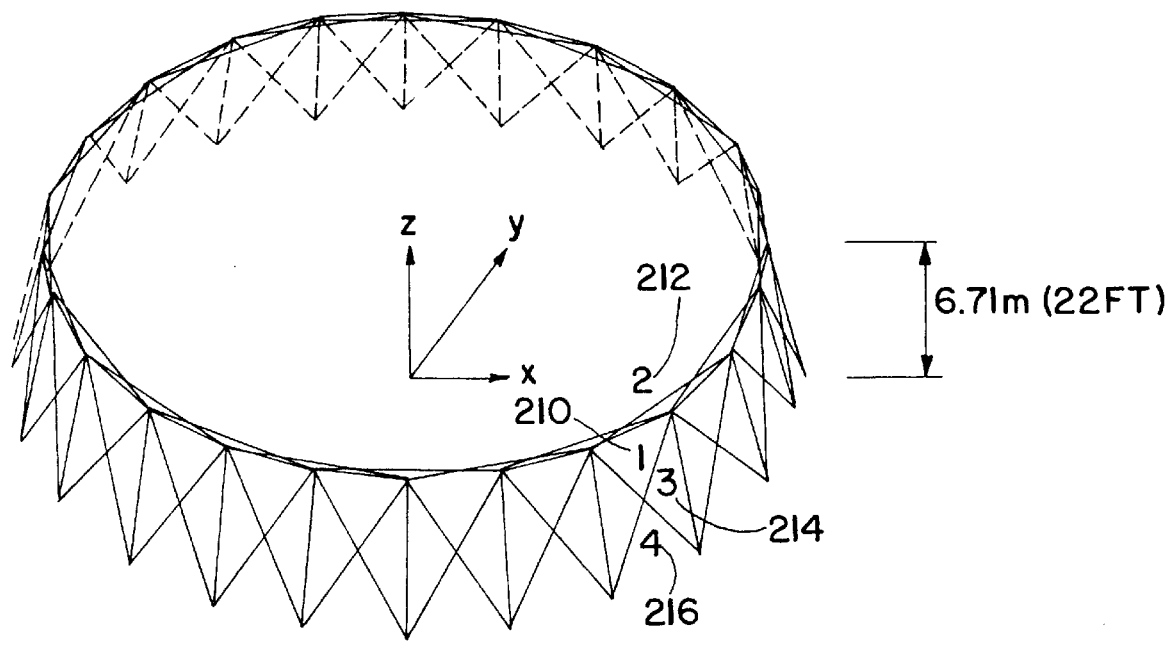
FIGS. 13a and 13b are illustrations of modules for the building structure of FIG. 12.

Referring to FIG. 12, this example is a large and very tall hollow space steel structure with a height of 492.9 m (1617 ft). The structure has 1801 nodes, 8904 members, and an aspect ratio of 7.2. It has three main sections 200, 202, 204 and two smaller sections 206, 208. As shown in FIG. 13a, each section consists of 24 modules. Each module has 24 equal sides at each floor level with a height of 6.7 m (22 ft).

Figure 13B:
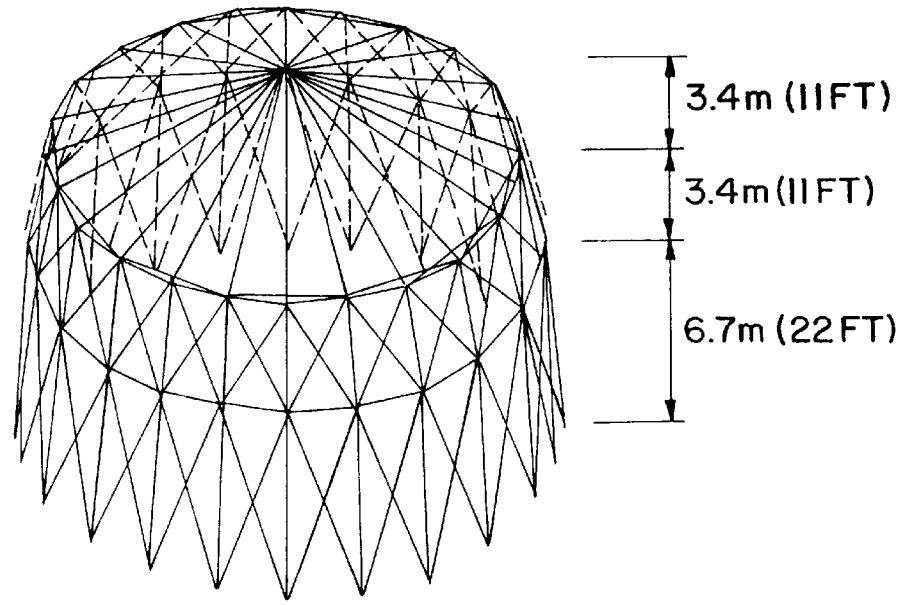

The 8904 members of the structure are divided into 297 groups. In the three main sections (FIG. 12 200, 202, 204), each module has four different types of members indicated in FIG. 13a. Member types 1 (210) and 2 (212) are horizontal members. Member type 3 (214) is slightly inclined from the vertical line (4 degrees in section 1 (FIG. 12 200), 3 degrees in section 2 (FIG. 12 202), and 2 degrees in section 3 (FIG. 12 204)). Finally, the cross bracing members are grouped as member type 4 216. In the truncated section 4 (FIG. 12 206), the grouping of the members is similar to section 1 to 3. In the conical section 5 of the structure (FIG. 12 208), there are 24 members grouped as one type as shown in FIG. 13b.

For displacement constraints, the interstory drift is limited to 0.0004 times the story height in any horizontal direction. The equivalent of a uniform vertical load of 1.92 kPa (40.0 psf) is assigned to the nodes of each floor. The structure is subjected to wind loads based on the UBC code similar to Example 1.

For this superhigh-rise structure, none of the W shapes commonly used for columns (with relatively high $r_y/r_x$ ratio) are sufficient for the slightly inclined members in the lowest five modules of section 1 (FIG. 12 200). These members are quite long (22.10 ft=6.72 m) in addition to being subjected to heavy axial forces. Additional built-up sections may be added to the AISC sections database. Fourteen (14) box-type built-up sections may be created by adding two plates to the ends of 14 W14 (14X223, 14X257, 14X283, 14X311, 14X370, 14X398, 14X426, 14X455, 14X500, 14X550, 14X605, 14X665, and 14X730) shapes. For these sections, the thickness of the end plates is the same as the thickness of the flange plates. The upper bound for the selected set of 58 W shapes (the same as those used for column members in Example 1) and 14 aforementioned built-up shapes is 2807.74 cm² (435.16 in.²). The lower bound is the same as the previous example.

Figure 14:
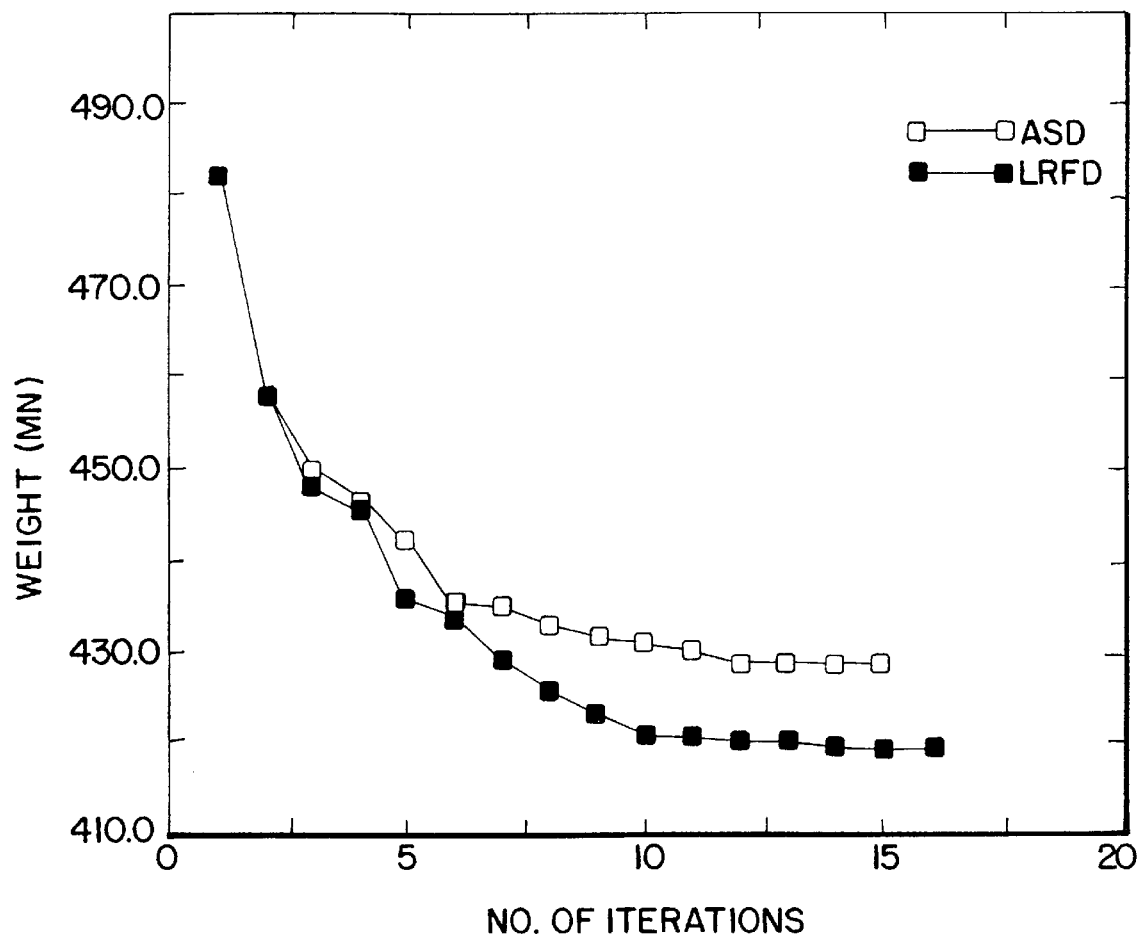
FIG. 14 is the convergence history for the automated design of the building structure of FIG. 12 in accordance with a preferred embodiment of the present invention.

The convergence histories for designs based on AISC ASD and LRFD codes are shown in FIG. 14. Minimum weights of 429.5 MN (96564.3 kips) and 419.7 MN (94354.8 kips) are obtained using the ASD and LRFD codes, respectively. The minimum weight design based on the LRFD code is 2.3% lighter than that based on the ASD code.

Example 3

Figure 15:
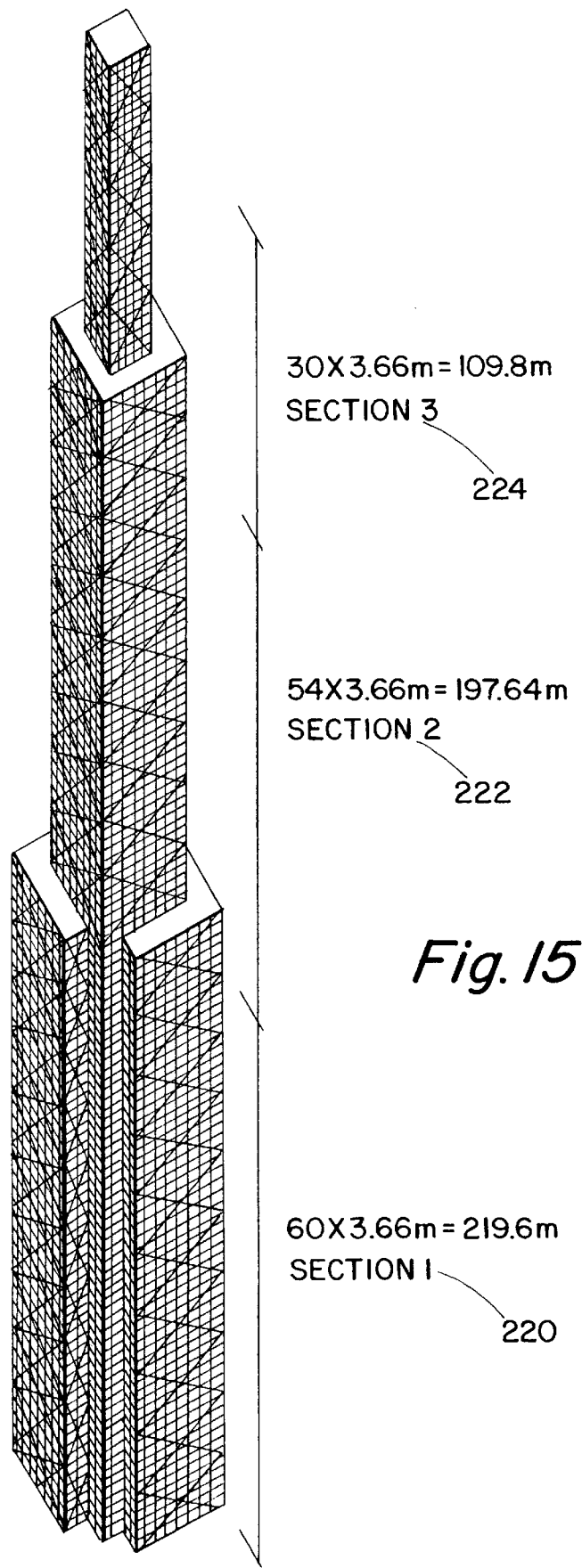
FIG. 15 is an illustration of a third building structure designed in accordance with a preferred embodiment of the present invention.
Figure 16:
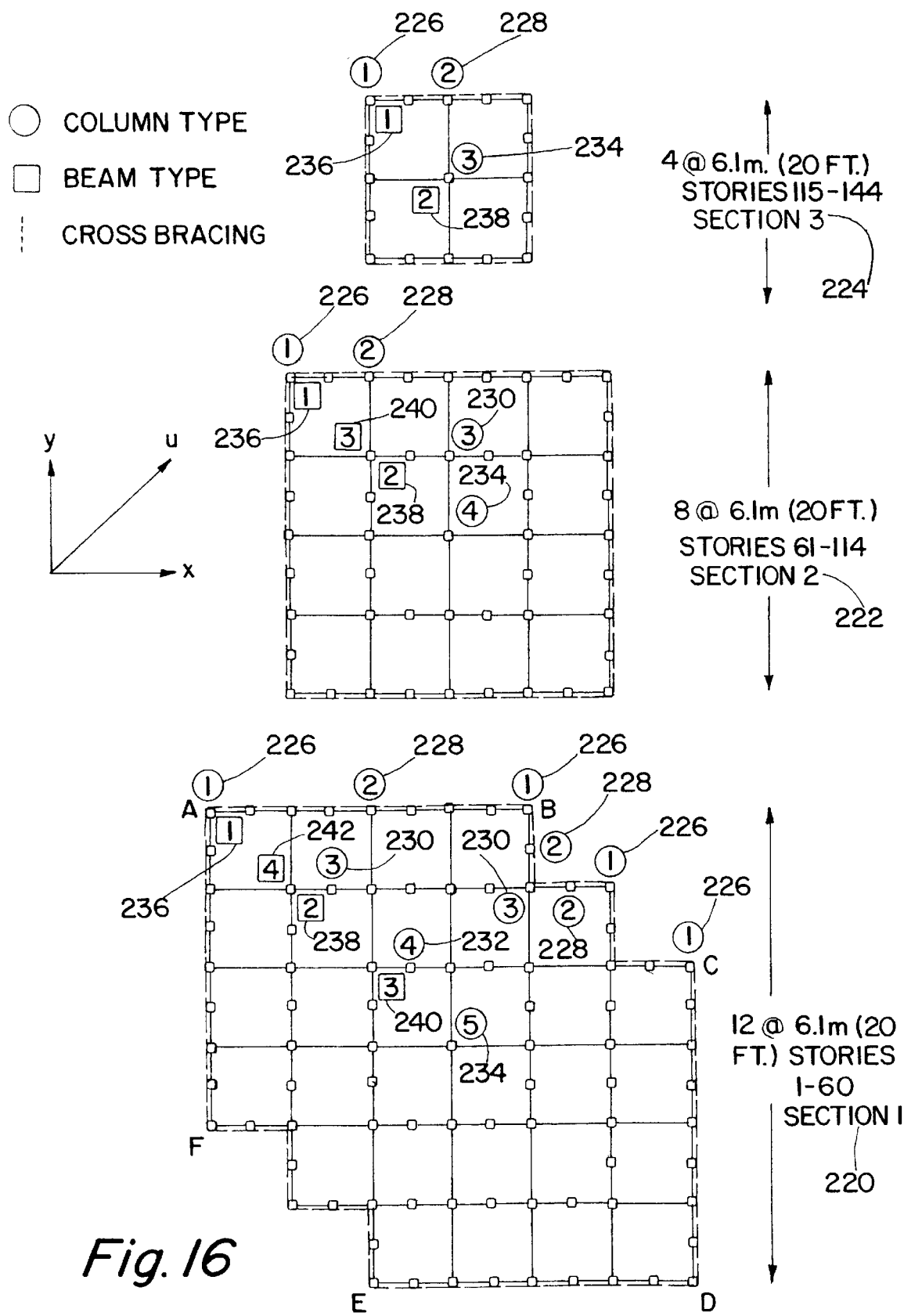
FIG. 16 is a floor plan of the building structure of FIG. 15.

Referring to FIG. 15, this example is a 144-story steel superhigh-rise building structure with a height of 526.7 m (1728 ft). The structure, divided into three section 220, 222, 224, is a modified tube-in-tube system consisting of a space moment-resisting frame with cross bracings on the exterior of the structure. The structure has 8463 nodes and an aspect ratio of 7.2. The 20,096 members of the structure are divided into 568 groups. Referring to FIG. 16, in section 1 of the structure 220, five different types of columns are used in every two stories as follows: corner columns in the outer tube 226, non-corner columns in the outer tube 228, columns in the middle tube 230, columns in the inner tube 232, and the center column 234. Four different types of beams are used in every two stories as follows: beams in the outer tube 236, beams in the middle tube 238, beams in the inner tube 240, and beams connecting and within the tubes 242. Two types of bracings cover every six stories: one type covers the faces AB, CD, DE, and AF, the other type covers the two corner regions BC and EF.

In section 2, four different types of columns are used in every two stories as follows: corner columns in the outer tube 226, non-corner columns in the outer tube 228, columns in the inner tube 230, and the center column 234. The beams of every two stories are divided into three groups: beams in the outer tube 236, beams in the inner tube 238, and beams connecting and within the tubes 240. The same type of bracings is used in every six stories.

In section 3, three different types of columns are used in every two stories as follows: corner columns 226, outer columns 228, and a center column 234. The beams of every two stories in this section are divided into two groups: inner beams 236 and outer beams 238. The same type of bracings is used in every six stories.

For displacement constraints, the interstory drift is limited to 0.0004 times the story height in both x and y directions. The loading on the structure consists of dead load of 2.40 kPa (50 psf), live load 2.40 kPa (50 psf) in section 1 (FIG. 15 220) and dead load of 2.40 kPa (50 psf), live load 1.92 kPa (40 psf), and roof live load 1.92 kPa (40 psf) in sections 2 (FIG. 15 222) and 3 (FIG. 15 224). The structure is subjected to wind loads based on the UBC code similar to Example 1. In this example, wind loads are applied in three different directions x, y, and u (FIG. 14).

The same set of 162 W shapes used in Example 1 are used as potentially economical beam members. The same set of 72 W and built-up shapes used in the Example 2 are used as potentially economical sections for columns and bracing members.

The lower bounds for column/bracing and beam members are 35.7 cm2 (5.54 in. 2) and 33.9 cm$^2$ (5.26 in.$^2$), respectively. The upper bounds for column/bracing and beam sections are 2807.74 cm$^2$ (435.16 in.$^2$) and 1606.4 cm$^2$ (249.0 in.$^2$), respectively.

Figure 17:
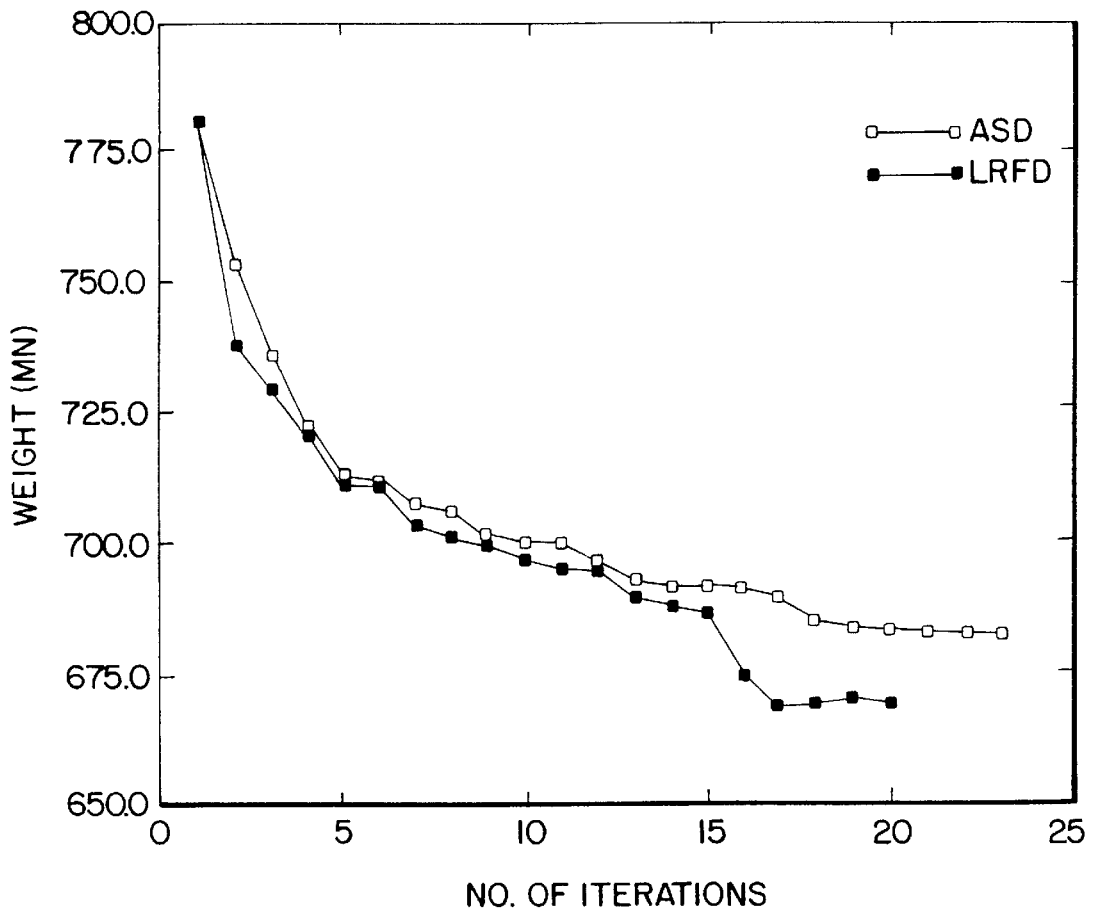
FIG. 17 is the convergence history for the automated minimum weight design of the building structure of FIG. 15 in accordance with a preferred embodiment of the present invention.

The convergence histories for designs based on AISC ASD and LRFD codes are shown in FIG. 17. Minimum weights of 682.2 MN (153381.4 kips) and 669.3 MN (150467.2 kips) are obtained using the ASD and LRFD codes, respectively. These translate into 1.57 kPa (34.43 psf) and 1.54 kPa (33.78 psf) for ASD and LRFD codes, respectively, when the total weight of the structure is divided by the total floor area provided by the structure. The minimum weight design based on the LRFD code is about 2.0% less than that based on the ASD code. It may be noted that the amount of steel used in the currently tallest building structure in world, the 109 story Sears building in Chicago with a height of 445.0 m, is about 33 psf.

End of Examples

SUMMARY

The present invention, based on neurocomputing and parallel processing paradigms, is a data model and related algorithms for structural design automation. A neural dynamic model is presented for optimal design of structures by integrating penalty function method, Lyapunov stability theorem, Kuhn-Tucker conditions, and the neural dynamic concept. The present invention may be used for automation and optimization of various engineering designs such as automobiles, airplanes, fighters, building structures, and high-performance computer chips.

APPENDIX A

A=cross-sectional area of a member
$A_f$=flange area of a W shape
$b_f$=flange width of a W shape
$C_i$=ith inhibitory recurrent connection in the variable layer
$C_w$=warping constant
d=depth a W shape
$d_{ij}$=Euclidean distances between the ith design variable and weights of the links between the variable layer and competition layers
gj(x)=jth constraint function
h=clear distance between flanges of a W shape
$I_x$=moment of inertia with respect to the major axis of the cross-section
$I_y$=moment of inertia with respect to the minor axis of the cross-section
J=torsional constant
K=stiffness matrix
k=number of design variables
M=number of elements in the structure
$M_{ntxj}$=required flexural strength in member j assuming there is no lateral translation
$M_{ltxj}$=required flexural strength in member j due to lateral translation only
$M_{nxj}$=nominal flexural strength of member j
$M_{uxj}$=required flexural strength of member j
D=diagonal preconditioner
N=number of constrained degrees-of-freedoms
$N_1$=number of design variables assingned to a PE (or VU)
$N_2$=number of degrees-of-freedom per node
$N_d$=number of degress-of-freedom assigned to a PE (or VU)
$N_j$=number of joints in a structure
$N_m$=number of members assigned to a PE (or VU)
$N_p$=number of available processors
$O_{cj}$=output from the jth node in the constriant layer
P=nodal force vector
p=search direction vector
$P_{nj}$=nominal compressive strength of member j
$P_{uj}$=required compressive strength of member j

TABLE 1

A=cross-sectional area of a member
$b_f$=width of the flange of a W shape
$dg_i/dX_j$=sensitivity coefficient of the ith constraint with respect to the jth design variable
$d/A_f$=the ratio of the depth to the area of the flange of a W shape
$D_i$=number of members grouped as the ith design variable
F(X)=objective function
$g_j$(X)=jth normalized stress constraint
$g_k$(X)=kth normalized displacement constraint
$I_x$=moments of inertia with respect to the major axis of the cross-section
$I_y$=moments of inertia with respect to the minor axis of the cross-section
J=torsional constant
K=number of design variables
L=length of a member
M=number of members in the structure
N=number of constrained degrees of freedoms
P(X)=penalty function
$t_n$=penalty parameter
$t_T$=radius of gyration of section consisting of compression flange and one-third the compression web area
$t_x$=radius of gyration with respect to the major axis of the cross-section
$t_y$=radius of gyration with respect to the minor axis of the cross-section
S=number of nodes in the interpolation layer
$S_{x,y}$=elastic section modulus
T=number of nodes in the competition layer
V(X)=pseudo-objective function (Lyapunov function)
$X_i$=ith design variable
$\dot{X}_i$=time derivative of $X_i$
X=vector of design variables
ε=tolerance for convergence
∇F(X)=gradient vector of the objective function
∇$g_j$(X)=gradient vector of the jth stress constraint function
∇$g_k$(X)=gradient vector of the kth displacement constraint function
ρ=specific weight of the member $\sigma_i$=stress in the ith member
$\psi(n)$=error function.
r=residual (error) vector
$t_n$=penalty parameter
$t_T$=radius of gyration of section consisting of the compression flange and one-third of the compression web with respect to an axis in the plane
$t_x$=radius of gyration with respect to the major axis
$t_y$=radius of gyration with respect to the minor axis
S=number of nodes in the interpolation layer
$S_x$=elastic section modulus with respect to the major axis
$S_y$=elastic section modulus with respect to the minor axis
T=number of nodes in the competition layer
$t_f$=flange thickness of a W shape
$t_w$=web thickness of a W shape
$U_{ij}$=weight of connection between the variable layer and competition layers
u=nodal displacement vector
$V_{jk}$=weight of connection between the competition and interpolation layers
$w_{ji}$=weight of inhibitory connection between the constraint and variable layers
$X_i$=design variable i
$\dot{X}_i$=time derivative of $X_i$
X=vector of design variables
$Y_{ik}$=kth sectional property of the W shape for the ith design variable
$Z_{ij}$=the output of nodes in the competition layer
$Z_x$=plastic section modulus with respect to the major axis
$Z_y$=plastic section modulus with respect to the minor axis
$\phi_b$=resistance factor for flexure
$\phi_c$=resistance factor for compression
$\theta_{ij}$=penalty term

What is claimed is:

1. A method of selecting structural members for an engineering design optimization for an engineering structure comprising structural members:

(a) defining a plurality of general non-linear constraints of said engineering structure;

(b) determining a design parameter of said structural members of said engineering structure;

(c) optimizing said design parameter in response to said plurality of general non-linear constraints through application of a learning rule through the integration of a Kuhn-Tucker necessary condition for at least one local minimum of a Lyapunov energy functional involving an exterior penalty function method and through application of a pseudo-objective function in the form of said Lyapunov energy functional; and (d) selecting structural members of said engineering structure in accordance with said optimization of said design parameter.

2. A computer for optimizing the engineering design for an engineering structure comprising structural members, said computer comprising:

a microprocessor being encoded with programming instructions, said instructions adapted to:

(a) define a plurality of general non-linear constraints of said engineering structure;

(b) determine a design parameter of said structural members of said engineering structure; and (c) optimize said design parameter in response to said plurality of general non-linear constraints through application of a learning rule through the integration of a Kuhn-Tucker necessary condition for at least one local minimum of a Lyapunov energy functional involving an exterior penalty function method and through application of a pseudo-objective function in the form of said Lyapunov energy functional.

3. A method of constructing an engineering structure comprising structural members and being of an optimized engineering design, said method comprising:

(a) defining a plurality of general non-linear constraints of said engineering structure;

(b) determining a design parameter of said structural members of said engineering structure;

(c) optimizing said design parameter in response to said plurality of general non-linear constraints and through application of a pseudo-objective function in the form of a Lyapunov energy functional involving an exterior penalty function method;

(d) selecting structural members of said engineering structure in accordance with said optimization of said design parameter; and (e) assembling said structural members so as to form said engineering structure.

4. A method according to claim 3 wherein said Lyapunov energy functional has at least one local minimum, and wherein said optimization of said design parameter is done through application of a learning rule through the integration of a Kuhn-Tucker necessary condition for said at least one local minimum of said Lyapunov energy functional.

5. A method according to claim 3 wherein said plurality of general non-linear constraints comprises at least one non-linear constraint.

6. A method according to claim 3 wherein said structural members have a collective cost and weight, and wherein said design parameter is selected from the group consisting of said cost and said weight.

7. A method according to claim 3 wherein said optimization is done in accordance with a neural network topology for optimization of structures with discrete members, said neural network topology comprising:

(a) a variable layer comprising a plurality of design variables, each of said design variables corresponding to a node in said variable layer;

(b) a competition layer comprising a plurality of sections, each of said sections corresponding to a node in said competition layer;

(c) a constraint layer comprising a plurality of constraints, each of said constraints corresponding to said discrete members and each of said constraints corresponding to a node in said constraint layer;

(d) an interpolation layer comprising a plurality of sectional properties, each of said sectional properties corresponding to said sections;

(e) inhibitory connections between each of said nodes in said variable layer and each of said nodes in said constraint layer, each of said inhibitory connections assigned a respective sensitivity coefficient of constraint;

(f) excitatory connections between each of said nodes in said variable layer and each of said nodes in said competition layer, each of said excitatory connections having encoded therein a design variable of each of said sections; and (g) excitatory connections between each of said nodes in said competition layer and each of said nodes in said interpolation layer, each of said excitatory connections having encoded therein a sectional property of each of said sections.

8. A method of selecting structural members for an engineering design optimization for an engineering structure comprising structural members:
   (a) defining a plurality of general non-linear constraints of said engineering structure;
   (b) determining a design parameter of said structural members of said engineering structure;
   (c) optimizing said design parameter in response to said plurality of general non-linear constraints and through application of a pseudo-objective function in the form of a Lyapunov energy functional involving an exterior penalty function method, wherein said optimization is done in accordance with a neural network topology for optimization of structures with discrete members, said neural network topology comprising:
      (i) a variable layer comprising a plurality of design variables, each of said design variables corresponding to a node in said variable layer;
      (ii) a competition layer comprising a plurality of sections, each of said sections corresponding to a node in said competition layer;
      (iii) a constraint layer comprising a plurality of constraints, each of said constraints corresponding to said discrete members and each of said constraints corresponding to a node in said constraint layer;
      (iv) an interpolation layer comprising a plurality of sectional properties, each of said sectional properties corresponding to said sections;
      (v) inhibitory connections between each of said nodes in said variable layer and each of said nodes in said constraint layer, each of said inhibitory connections assigned a respective sensitivity coefficient of constraint;
      (vi) excitatory connections between each of said nodes in said variable layer and each of said nodes in said competition layer, each of said excitatory connections having encoded therein a design variable of each of said sections; and
      (vii) excitatory connections between each of said nodes in said competition layer and each of said nodes in said interpolation layer, each of said excitatory connections having encoded therein a sectional property of each of said sections; and
   (d) selecting structural members of said engineering structure in accordance with said optimization of said design parameter.

9. A computer for optimizing the engineering design for an engineering structure comprising structural members, said computer comprising:
   a microprocessor being encoded with programming instructions, said instructions adapted to:
      (a) define a plurality of general non-linear constraints of said engineering structure;
      (b) determine a design parameter of said structural members of said engineering structure; and
      (c) optimize said design parameter in response to said plurality of general non-linear constraints and through application of a pseudo-objective function in the form of a Lyapunov energy functional involving an exterior penalty function method, wherein said optimization is done in accordance with a neural network topology for optimization of structures with discrete members, said neural network topology comprising:
         (i) a variable layer comprising a plurality of design variables, each of said design variables corresponding to a node in said variable layer;
         (ii) a competition layer comprising a plurality of sections, each of said sections corresponding to a node in said competition layer;
         (iii) a constraint layer comprising a plurality of constraints, each of said constraints corresponding to said discrete members and each of said constraints corresponding to a node in said constraint layer;
         (iv) an interpolation layer comprising a plurality of sectional properties, each of said sectional properties corresponding to said sections;
         (v) inhibitory connections between each of said nodes in said variable layer and each of said nodes in said constraint layer, each of said inhibitory connections assigned a respective sensitivity coefficient of constraint;
         (vi) excitatory connections between each of said nodes in said variable layer and each of said nodes in said competition layer, each of said excitatory connections having encoded therein a design variable of each of said sections; and
         (vii) excitatory connections between each of said nodes in said competition layer and each of said nodes in said interpolation layer, each of said excitatory connections having encoded therein a sectional property of each of said sections.

* * * * *